(12) United States Patent
Wang et al.

(10) Patent No.: US 11,094,713 B2
(45) Date of Patent: *Aug. 17, 2021

(54) THREE-DIMENSIONAL MEMORY DEVICE WITH SOURCE CONTACTS CONNECTED BY AN ADHESION LAYER AND METHODS FOR FORMING THE SAME

(71) Applicant: YANGTZE MEMORY TECHNOLOGIES CO., LTD., Wuhan (CN)

(72) Inventors: Qingqing Wang, Wuhan (CN); Wei Xu, Wuhan (CN); Pan Huang, Wuhan (CN); Ping Yan, Wuhan (CN); Zongliang Huo, Wuhan (CN); Wenbin Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/689,513

(22) Filed: Nov. 20, 2019

(65) Prior Publication Data

US 2021/0066336 A1   Mar. 4, 2021

Related U.S. Application Data

(63) Continuation of application No. PCT/CN2019/103860, filed on Aug. 30, 2019.

(51) Int. Cl.
*H01L 27/11582* (2017.01)
*H01L 27/11565* (2017.01)
(Continued)

(52) U.S. Cl.
CPC .... *H01L 27/11582* (2013.01); *H01L 23/5283* (2013.01); *H01L 27/1157* (2013.01); *H01L 27/11565* (2013.01)

(58) Field of Classification Search
CPC ......... H01L 27/11582; H01L 27/11565; H01L 27/1157
See application file for complete search history.

(56) References Cited

U.S. PATENT DOCUMENTS 9,520,403 B2 * 12/2016 Ahn ................. H01L 27/11582
10,566,336 B1 * 2/2020 Guo ................. H01L 27/11556
(Continued)

FOREIGN PATENT DOCUMENTS

CN  107810554 A  3/2018
CN  109417078 A  3/2019
(Continued)

OTHER PUBLICATIONS

International Search Report issued in corresponding International Application Na PCT/CN2019/103860, dated May 26, 2020, 4 pages.
(Continued)

*Primary Examiner* — Stephen M Bradley
*Assistant Examiner* — Gustavo G Ramallo
(74) *Attorney, Agent, or Firm* — Bayes PLLC

(57) ABSTRACT

A three-dimensional (3D) memory device includes a memory stack over a substrate. The memory stack includes interleaved conductor layers and insulating layers. The 3D memory device also includes channel structures extending vertically in the memory stack. The 3D memory device further includes a source structure extending in the memory stack. The source structure includes first and second source contacts separated by a support structure. The source structure also includes an adhesion layer. At least a portion of the adhesion layer is between the first and second source contacts and conductively connects the first and second source contacts.

20 Claims, 22 Drawing Sheets

(51) Int. Cl.
    *H01L 27/1157*     (2017.01)
    *H01L 23/528*     (2006.01)

(56) References Cited

U.S. PATENT DOCUMENTS

| | | | |
|---|---|---|---|
| 2006/0178007 A1* | 8/2006 | Nakamura | H01L 27/124 |
| | | | 438/675 |
| 2016/0079254 A1 | 3/2016 | Shimura | |
| 2017/0148800 A1 | 5/2017 | Nishikawa et al. | |
| 2018/0130814 A1* | 5/2018 | Lee | H01L 27/11568 |
| 2019/0157406 A1* | 5/2019 | Hwang | H01L 21/28518 |
| 2020/0388567 A1* | 12/2020 | Mignot | H01L 23/5226 |
| 2021/0050358 A1* | 2/2021 | Xu | H01L 21/76834 |
| 2021/0050366 A1* | 2/2021 | Huang | H01L 21/31116 |
| 2021/0050367 A1* | 2/2021 | Xu | H01L 21/31116 |
| 2021/0066461 A1* | 3/2021 | Xia | H01L 21/823487 |

FOREIGN PATENT DOCUMENTS

| | | |
|---|---|---|
| CN | 109742083 A | 5/2019 |
| CN | 109904170 A | 6/2019 |
| CN | 110112134 A | 8/2019 |

OTHER PUBLICATIONS

Written Opinion of the International Searching Authority issued in corresponding International Application No. PCT/CN2019/103860, dated May 26, 2020, 5 pages.

* cited by examiner

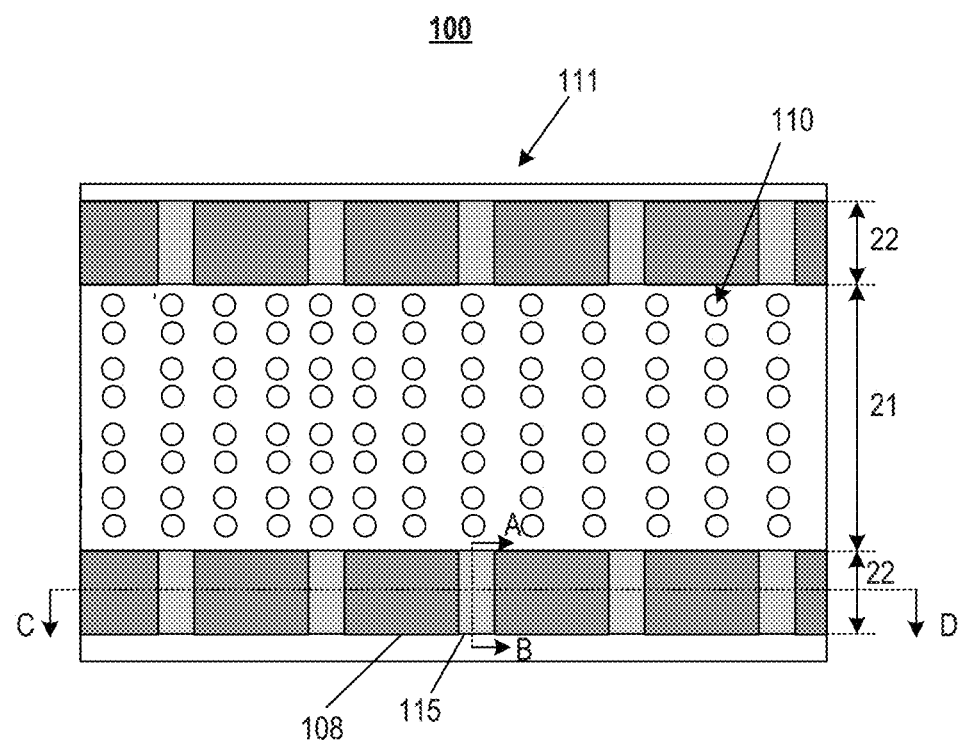
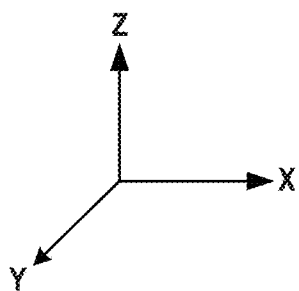
FIG. 1

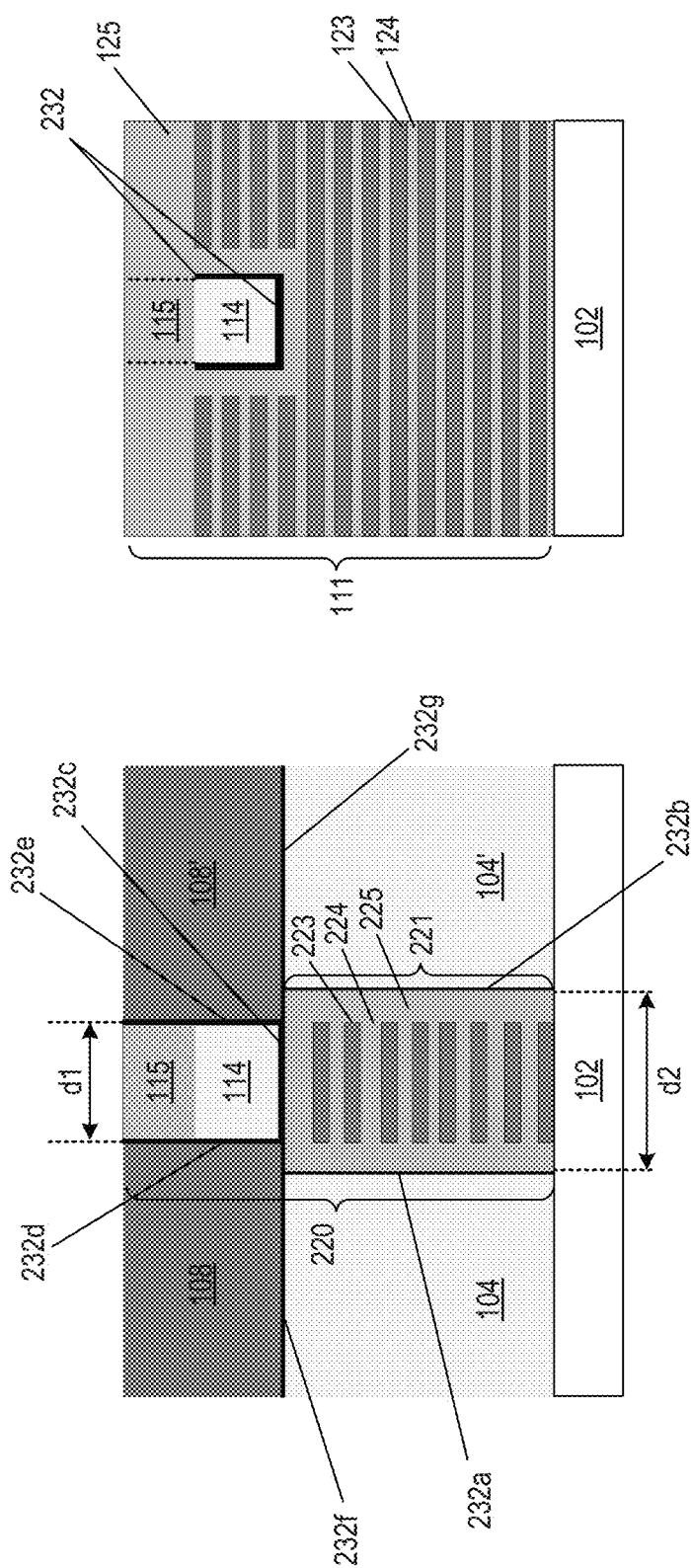

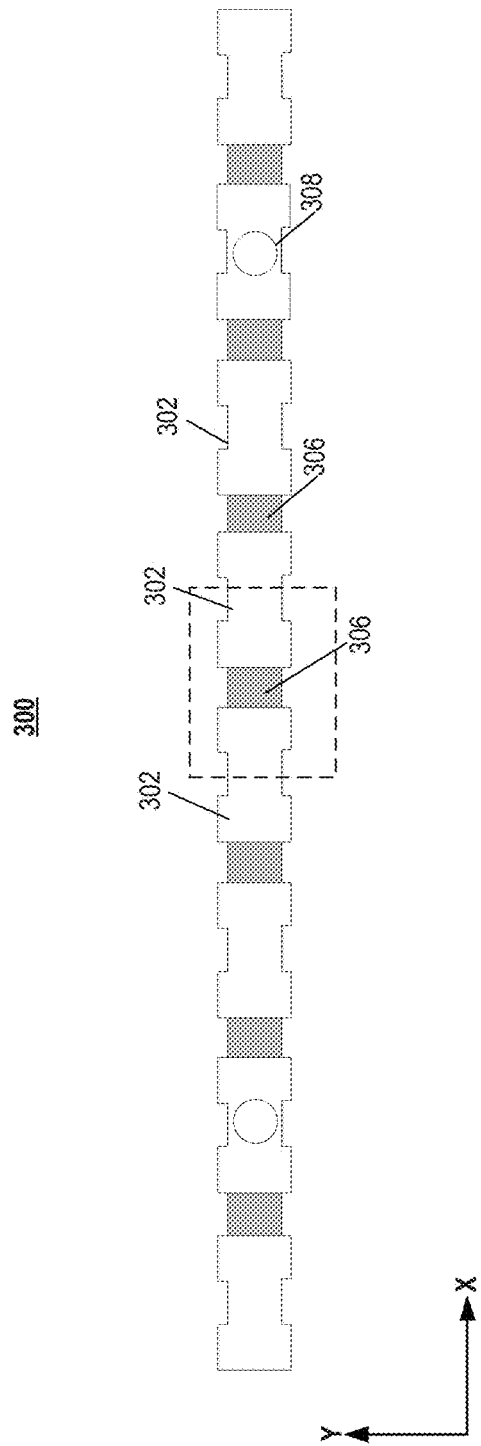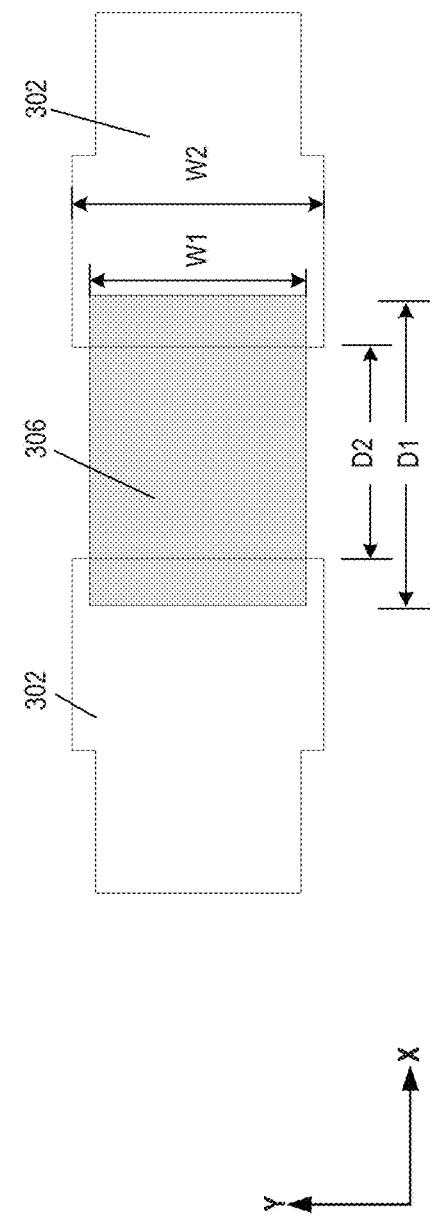

THREE-DIMENSIONAL MEMORY DEVICE WITH SOURCE CONTACTS CONNECTED BY AN ADHESION LAYER AND METHODS FOR FORMING THE SAME

CROSS-REFERENCE TO RELATED APPLICATIONS

This application is continuation of International Application No. PCT/CN2019/103860, filed on Aug. 30, 2019, entitled "THREE-DIMENSIONAL MEMORY DEVICE WITH SOURCE CONTACTS CONNECTED BY AN ADHESION LAYER AND METHODS FOR FORMING THE SAME." This application is also related to U.S. application Ser. No. 16/689,539, filed on Nov. 20, 2019, entitled "THREE-DIMENSIONAL MEMORY DEVICE WITH SOURCE CONTACTS CONNECTED BY AN ADHESION LAYER AND METHODS FOR FORMING THE SAME," which is hereby incorporated by reference in its entirety.

BACKGROUND

Embodiments of the present disclosure relate to three-dimensional (3D) memory devices having source structures of reduced resistance, and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a memory stack over a substrate. The memory stack includes interleaved a plurality of conductor layers and a plurality of insulating layers. The 3D memory device also incudes a plurality of channel structures extending vertically in the memory stack. The 3D memory device further includes a source structure extending in the memory stack. The source structure includes first and second source contacts separated by a support structure. The source structure also includes an adhesion layer. At least a portion of the adhesion layer is between the first and second source contacts and conductively connects the first and second source contacts.

In another example, a 3D memory device includes a memory stack over a substrate. The memory stack includes interleaved a plurality of conductor layers and a plurality of insulating layers. The 3D memory device also includes a plurality of channel structures extending vertically in the memory stack. The 3D memory device also includes a plurality of source structures extending in parallel along a lateral direction in the memory stack. The plurality of source structures each includes a plurality of source contacts arranged along the lateral direction. Each of the plurality of source structures also includes a plurality of support structures arranged along the lateral direction. Each of the plurality of support structures separates two adjacent source contacts. Each of the plurality of source structures further includes an adhesion layer conductively connecting at least two of the plurality of source contacts separated by at least one of the support structures.

In a further example, a method for forming a 3D memory device includes forming a cut structure in a stack structure. The stack structure includes interleaved a plurality of initial sacrificial layers and a plurality of initial insulating layers. The method also includes removing portions of the stack structure adjacent to the cut structure to form a slit structure and an initial support structure. The initial support structure divides the slit structure into a plurality of slit openings. The method further includes forming a plurality of conductor portions in the initial support structure through the plurality of slit openings. The method also includes forming a source contact in each of the plurality of slit openings. The method also includes removing portions of the initial support structure to form a support structure. The support structure includes an adhesion portion extending through the support structure. In addition, the method includes forming an adhesion layer over the source contact in each of the plurality of slit openings. At least two adhesion layers are conductively connected to the adhesion portion extending through the support structure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 1 illustrates a plan view of an exemplary 3D memory device having source contacts connected by an adhesion layer, according to some embodiments of the present disclosure.

FIG. 2A illustrates a cross-sectional view of the 3D memory device illustrated in FIG. 1 along the C-D direction, according to some embodiments of the present disclosure.

FIG. 2B illustrates a cross-sectional view of the 3D memory device illustrated in FIG. 1 along the A-B direction, according to some embodiments of the present disclosure.

FIG. 3A illustrates a plan view of an exemplary pattern set for forming various structures in a fabrication process for forming a 3D memory device, according to some embodiments of the present disclosure.

FIG. 3B illustrates an enlarged view of a portion of the pattern set shown in FIG. 3A, according to some embodiments of the present disclosure.

Figure 4A:
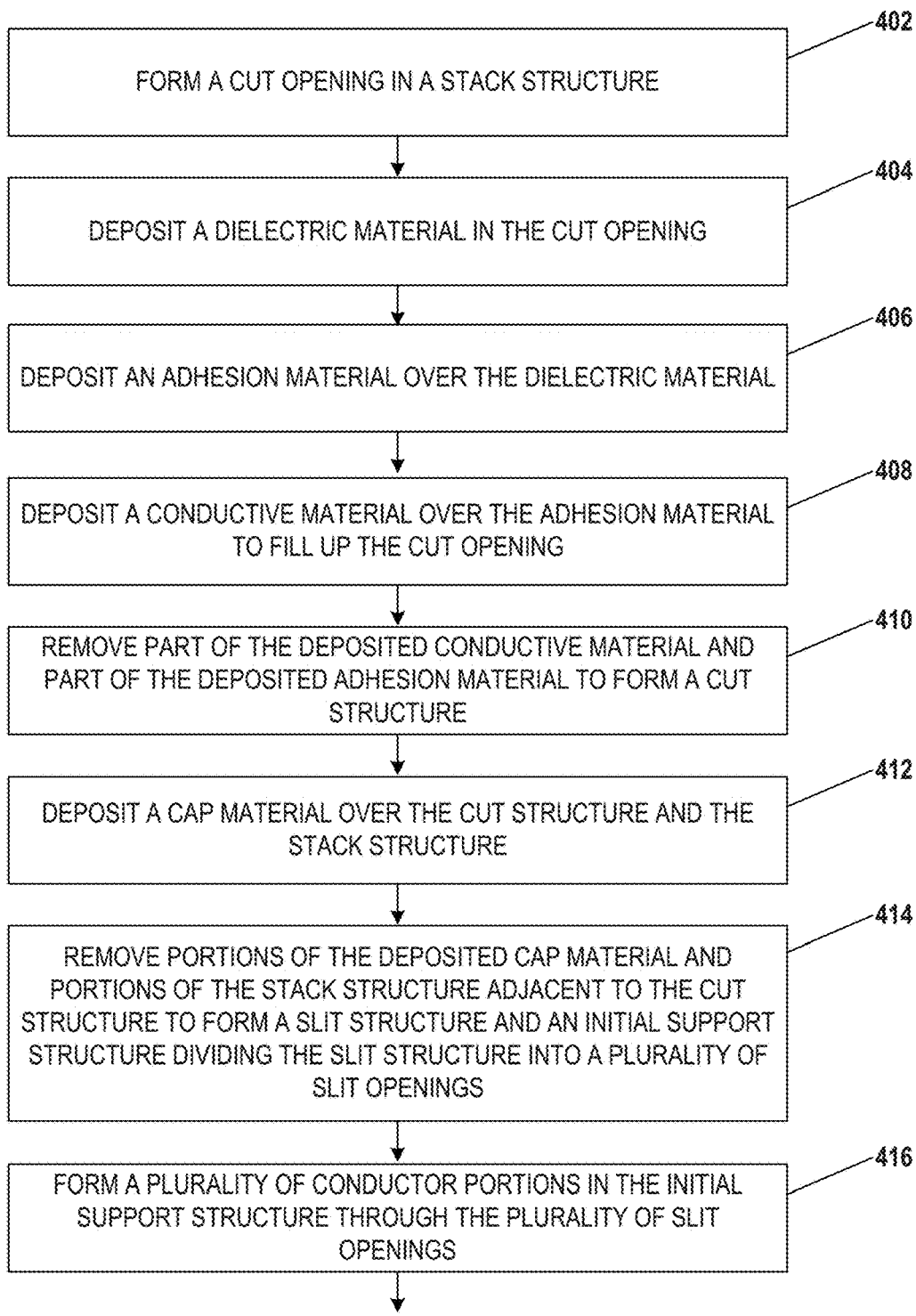
FIGS. 4A and 4B illustrate a flowchart of an exemplary fabrication process for forming a 3D memory device having source contacts connected by an adhesion layer, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile, light-weighted, of low power consumption and good performance. Currently, planar NAND flash memory devices have reached its storage limit. To further increase the storage capacity and reduce the storage cost per bit, 3D NAND memory devices have been proposed. An existing 3D NAND memory device often includes a plurality of memory blocks. Adjacent memory blocks are often separated by a GLS, in which an array common source (ACS) is formed. In the fabrication method to form the existing 3D NAND memory device, due to an increased number of levels (or conductor/insulator pairs), the etching process to form GLSs become challenging. For example, GLSs can be more susceptible to deformation, e.g., fluctuation of feature size, causing memory blocks neighboring the GLSs to deform or even collapse. The performance of the 3D NAND memory device can be affected.

Figure 21:
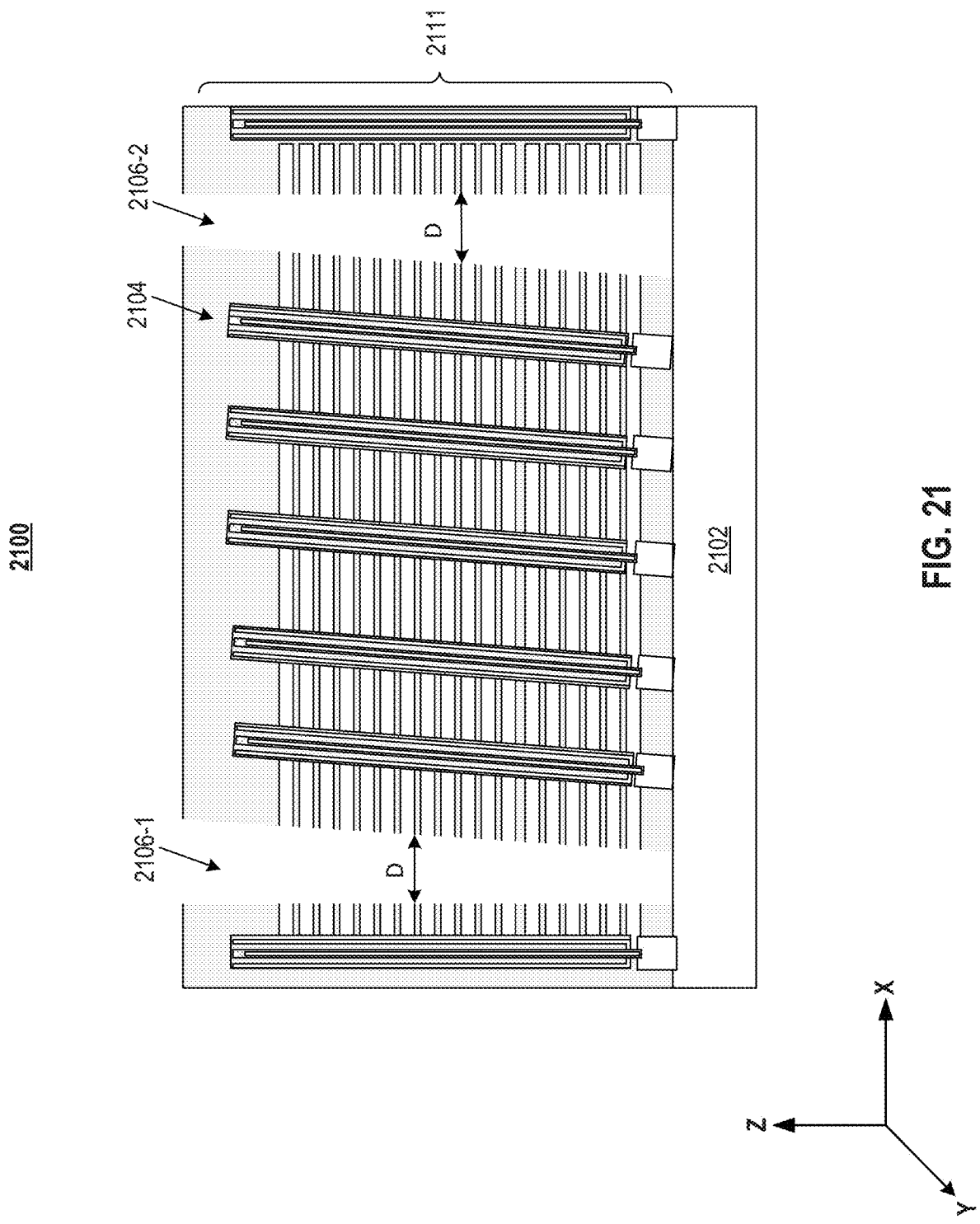
FIG. 21 illustrates a cross-sectional view of an existing 3D memory device with deformed gate line slits (GLSs).

FIG. 21 illustrates an existing 3D memory device 2100 with deformed GLSs and a deformed memory block. As shown in FIG. 21, a memory stack 2111 is formed over a substrate 2102. A plurality of GLSs, e.g., 2106-1 and 2106-2, extend through memory stack 2111 to expose substrate 2102. A plurality of channel structures 2104 are arranged in a memory block between GLSs 2106-1 and 2106-2. Due to deformation, a lateral dimension, e.g., diameter D, of a GLS (e.g., 2106-1 or 2106-2) varies along the vertical direction (e.g., the z-direction), causing the memory block and channel structures 2104 to move from their desired position/orientation. These deformations can lead to photolithography misalignment and electrical leakage in subsequent fabrication processes that form ACSs in the GLSs.

The present disclosure provides 3D memory devices (e.g., 3D NAND memory devices) having source structures with reduced resistance, and methods for forming the 3D memory devices. For example, an exemplary 3D memory device employs one or more support structures that divide a slit structure into a plurality of slit openings, in which source contacts are formed. The support structures are each in contact with adjacent memory blocks, providing support to the entire structure of the 3D memory device during the formation of conductor layers/portions and source contacts. The 3D memory device is then less susceptible to deformation or damages during the fabrication process.

In an exemplary 3D memory device disclosed herein, at least two of the source contacts separated by a support structure are conductively connected to each other through an adhesion layer. An adhesion layer (also known as a "liner layer" or a "glue layer") is an intermediary layer over which a primary layer is formed. Application of an adhesion layer can improve the adhesion of the primary layer. An adhesion layer can be deposited prior to the deposition of the primary layer to enhance adhesion of the primary layer, such as an ACS. An adhesion layer may include multiple sub-layers.

An adhesion layer is conductive and can include metals (e.g., titanium (Ti), tantalum (Ta), chromium (Cr), tungsten (W), etc.), metal compounds (e.g., titanium nitride (TiNx), tantalum nitride (TaNx), chromium nitride (CrNx), tungsten nitride (WNx), etc.), and/or metal alloys (e.g., TiSixNy, TaSixNy, CrSixNy, WSixNy, etc.). The specific material(s) of the adhesion layer may be determined based on the material of the primary layer (e.g., W or Cu). In some embodiments, the specific material(s) of the adhesion layer may be determined based on the base layer/substrate (e.g., the layer over which the adhesion layer is deposited, including silicon, dielectrics, metals, etc.). An adhesion layer functions as a conductive link electrically connecting the at least two source contacts. Instead of applying a source voltage on each of the plurality of source contacts using a respective contact plug, the source voltage can be applied to any one of the source contacts that are electrically connected together by one or more adhesion layers. As a result, fewer contact plugs are needed to apply the source voltage, reducing the resistance of the source structure. The contact area between the adhesion layer and a source contact can be sufficiently large to further reduce the resistance of the source structure. In some embodiments, the adhesion layer is in contact with and conductively connected to all of the source contacts in a source structure, further reducing the resistance of the source structure.

In some embodiments, the adhesion layer may also serve as the barrier layer, which can mitigate the metal atoms of the primary layer (e.g., Cu) out-diffusion directly into the device, or indirectly (e.g., through an insulating or a dielectric layer) into the device.

FIG. 1 illustrates a plan view of an exemplary 3D memory device 100, according to some embodiments. FIG. 2A illustrates a cross-sectional view of the 3D memory device 100 shown in FIG. 1 along the C-D direction. FIG. 2B illustrates a cross-sectional view of the 3D memory device 100 shown in FIG. 1 along the A-B direction. As shown in FIG. 1, 3D memory device 100 may include a core region in which one or more, e.g., a pair of, source regions 22 extending along the x-direction. A source structure may be formed in each source region 22. One or more block regions 21, in which a plurality of memory cells are formed, may be between the pair of source regions 22. A memory block may be formed in each block region 21.

As shown in FIGS. 1, 2A, and 2B, 3D memory device 100 may include a substrate 102, and a stack structure 111 over substrate 102. In block regions 21, stack structure 111 (also referred to as "memory stack") may include a plurality of conductor layers 123 and a plurality of insulating layers 124 interleaved over substrate 102. Stack structure 111 may also include a dielectric cap layer 125 covering the plurality of conductor layers 123 and insulating layers 124. In block regions 21, stack structure 111 may also include a plurality of channel structures 110 extending from dielectric cap layer 125 into substrate 102 along a vertical direction (e.g., the z-direction). Each channel structure 110 may include an epitaxial portion at a bottom portion, a drain structure at a top portion, and a semiconductor channel between the epitaxial portion and the drain structure. The semiconductor channel may include a memory film, a semiconductor layer, and a dielectric core. The epitaxial portion may be in contact with and conductively connected to substrate 102. The semiconductor channel may be in contact with and conductively connected to the drain structure and the epitaxial portion. A plurality of memory cells may be formed by the semiconductor channels and control conductor layers.

A source structure may be formed in source region 22 to extend along the x-direction. The source structure may include a plurality of source contacts (e.g., 104, 104') separated by one or more support structures (e.g., 220). As used herein, two source contacts are separated by a support structure when the two source contacts are physically separated (e.g., no direct physical contact) by the support structure. The two source contacts, however, may be conductively (e.g., electrically) connected with each other through a conductive link, which may conductively connect to each of the two source contacts either directly (e.g., through physical contact) or indirectly (e.g., through one or more further conductive media). Embodiments of the present application disclose various conductive links conductively connecting multiple physically separated source contacts such that a single contact plug can supply source voltage to multiple source contacts conductively connected together.

A plurality of source contacts (e.g., 104, 104') formed in the same source region 22 (e.g., within the same source structure) may be aligned along the x-direction. Each source structure may extend vertically (along z-direction) through stack structure 111 and contact substrate 102. A source voltage can be applied to the memory cells through the source structure and substrate 102.

3D memory device 100 may include one or more support structures 220 aligned along the x-direction and dividing a source structure into the plurality of source contacts (e.g., 104, 104'). In some embodiments, support structure 220 includes a cap layer 115, a cut layer 114, and a portion stack 221. Portion stack 221 may include interleaved a plurality of conductor portions 223 and insulating portions 224 over substrate 102. Support structure 220 may be in contact with adjacent memory blocks (or block regions 21) along the y-direction, and separate adjacent source contacts (e.g., 104, 104') along the x-direction. Support structure 220 may provide support to 3D memory device 100 during the formation of the source structures and conductor layers 123. 3D memory device 100 may further include a connection layer (e.g., 108/108') over a source contact (e.g., 104/104') and conductively connected to the corresponding source contact. Adjacent connection layers (e.g., 108 and 108') may be separated by support structure 220 that also separates the respective source contacts (e.g., 104 and 104'). In some embodiments, source voltage may be applied to a source contact (e.g., 104) through its corresponding connection layer (e.g., 108). In some embodiments, multiple connection layers (e.g., 108, 108') may be conductively connected through, for example, cut layer 114 and/or an adhesion layer 232 (e.g., adhesion layer 232 may contain multiple portions 232a-232g). In this way, physically separated source contacts/connection layers can be conductively connected together, enabling application of the source voltage to multiple connected source contacts through a single contact plug. The resistance of the source structure can be reduced compared to applying the source voltage onto each source contact using a separate contact plug. Details of each structure illustrated in FIGS. 1, 2A, and 2B are described below.

Substrate 102 can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. In some embodiments, substrate 102 includes silicon.

Channel structures 110 may form an array and may each extend vertically above substrate 102. Channel structure 110 may extend through a plurality of pairs each including a conductor layer 123 and an insulating layer 124 (also referred to as "conductor/insulating layer pairs"). At least on one side along a horizontal direction (e.g., x-direction and/or y-direction), stack structure 111 can include a staircase structure (not shown). The number of the conductor/insulating layer pairs in stack structure 111 (e.g., 32, 64, 96, or 128) may determine the number of memory cells in 3D memory device 100. In some embodiments, conductor layers 123 and insulating layers 124 in stack structure 111 are alternatingly arranged along the vertical direction in block regions 21. Conductor layers 123 can include conductive materials including, but not limited to, tungsten (W), cobalt (Co), copper (Cu), aluminum (Al), polysilicon, doped silicon, silicide, or any combination thereof. Insulating layers 124 can include dielectric materials including, but not limited to, silicon oxide, silicon nitride, silicon oxynitride, or any combination thereof. In some embodiments, conductor layers 123 may include a top conductor layer having a plurality of top select conductor layers, and a bottom conductor layer having a plurality of bottom select conductor layers. The top select conductor layers may function as the top select gate electrodes, and the bottom select conductor layers may function as the bottom select gate electrodes. Conductor layers 123 between the top and bottom conductor layers may function as select gate electrodes and form memory cells with intersecting channel structures 110. Top select gate electrodes and bottom select gate electrodes can respectively be applied with desired voltages to select a desired memory block/finger/page.

Channel structure 110 can include a semiconductor channel extending vertically through stack structure 111. The semiconductor channel can include a channel hole filled with a channel-forming structure, e.g., semiconductor materials (e.g., as a semiconductor layer) and dielectric materials (e.g., as a memory film). In some embodiments, the semiconductor layer includes silicon, such as amorphous silicon, polysilicon, or single crystalline silicon. In some embodiments, the memory film is a composite layer including a tunneling layer, a memory layer (also known as a "charge trap layer"), and a blocking layer. The remaining space of the channel hole of the semiconductor channel can be partially or fully filled with a dielectric core including dielectric materials, such as silicon oxide. The semiconductor channel can have a cylinder shape (e.g., a pillar shape). The dielectric core, semiconductor layer, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, the memory layer can include a composite layer of silicon oxide/silicon oxynitride (or silicon nitride)/silicon oxide (ONO).

In some embodiments, channel structure 110 further includes an epitaxial portion (e.g., a semiconductor plug) in the lower portion (e.g., at the lower end of bottom) of channel structure 110. As used herein, the "upper end" of a component (e.g., channel structure 110) is the end farther away from substrate 102 in the vertical direction (z-direction), and the "lower end" of the component (e.g., channel structure 110) is the end closer to substrate 102 in the vertical direction when substrate 102 is positioned in the lowest plane of 3D memory device 100. The epitaxial portion can include a semiconductor material, such as silicon, which is epitaxially grown from substrate 102 in any suitable directions. It is understood that in some embodiments, the epitaxial portion includes single crystalline silicon, the same material as substrate 102. In other words, the epitaxial portion can include an epitaxially-grown semiconductor layer grown from substrate 102. The epitaxial portion can also include a different material than substrate 102. In some embodiments, the epitaxial portion includes at least one of silicon, germanium, and silicon germanium. In some embodiments, part of the epitaxial portion is above the top surface of substrate 102 and in contact with the semiconductor channel. The epitaxial portion may be conductively connected to the semiconductor channel. In some embodiments, a top surface of the epitaxial portion is located between a top surface and a bottom surface of a bottom insulating layer 124 (e.g., the insulating layer at the bottom of stack structure 111).

In some embodiments, channel structure 110 further includes a drain structure (e.g., channel plug) in the upper portion (e.g., at the upper end) of channel structure 110. The drain structure can be in contact with the upper end of a semiconductor channel and may be conductively connected to the semiconductor channel. The drain structure can include semiconductor materials (e.g., polysilicon) or conductive materials (e.g., metals). In some embodiments, the drain structure includes an opening filled with Ti/TiN or tantalum/tantalum nitride (Ta/TaN) as an adhesion layer and tungsten as a conductor material. By covering the upper end of semiconductor channel during the fabrication of 3D memory device 100, the drain structure can function as an etch stop layer to prevent etching of dielectrics filled in the semiconductor channel, such as silicon oxide and silicon nitride.

As shown in FIGS. 1, 2A, and 2B, a source structure can be formed in source region 22. The source structure, aligned along the x-direction, may include a plurality of source contacts (e.g., 104, 104') separated by one or more support structures (e.g., 220). Each source contact (e.g., 104/104') may be in contact with and conductively connected to substrate 102. An insulating structure (not shown) may be formed between a source contact and an adjacent memory block to insulate the respective source contact from conductor layers 123 in the adjacent memory block in block region 21. In some embodiments, source contact 104/104' includes at least one of polysilicon, aluminum, cobalt, copper, tungsten, or silicide. The insulating structure can include a suitable dielectric material, such as one or more of silicon oxide, silicon nitride, and silicon oxynitride.

The source structure may also include one or more support structures (e.g., 220) distributed along the x-direction. In some embodiments, each source structure includes at least one support structure (e.g., 220) dividing the respective source structure into a plurality of source contacts (e.g., 104 and 104'). For example, a first source contact 104 is separated from a second (e.g., adjacent) source contact 104' by support structure 220.

In some embodiments, the source structure may include an adhesion layer 232 between various components of the source structure. For example, adhesion layer 232 may include a plurality of portions 232a-232g, as shown in FIG. 2A. Portion 232a may be between source contact 104 and support structure 220. For example, portion 232a may be in contact with source contact 104 and conductively connect source contact 104 with other portions of adhesion layer 232. Similarly, portion 232b may be between source contact 104' and support structure 220. Portion 232b may be in contact with source contact 104' and conductively connect source contact 104' with other portions of adhesion layer 232. In some embodiments, portion 232c may establish a conductive link between source contacts 104 and 104'. For example, portion 232c may extend through support structure 220 and conductively connect portions 232a and 232b. Portion 232c may be between cut layer 114 and portion stack 221. In this way, source contacts 104 and 104' can be conductively connected to each other through portions of adhesion layer 232 (e.g., portions 232a, 232c, and 232b) between source contacts 104 and 104'.

In some embodiments, source contact 104 and 104' may conductively connect to each other via other portions or other combinations of portions of adhesion layer 232. For example, portion 232f may be between connection layer 108 and source contact 104. Portion 232f may be in contact with connection layer 108 and source contact 104 and conductively connect connection layer 108 and source contact 104. In this way, source contact 104 may conductively connect with other components of the source structure through connection layer 108 and/or portion 232f. Similarly, portion 232g may be between connection layer 108' and source contact 104'. Portion 232g may be in contact with connection layer 108' and source contact 104' and conductively connect connection layer 108' and source contact 104'. Source contact 104' can be conductively connected to other components of the source structure through connection layer 108' and/or portion 232g.

Portion 232f and/or connection layer 108 may conductively connect to portion 232g and/or connection layer 108' through a variety of ways. For example, portion 232c extending through support structure 220 may establish a conductive link between 108/232f and 108'/232g, as portion 232c may be in contact with 108/232f and with 108'/232g. In other words, portions 232f, 232c, and 232g may be parts of the same adhesion layer 232. In another example, cut layer 114 may establish a conductive link between 108/232f and 108'/232g. For instance, portion 232d may be between connection layer 108 and cut layer 114 and in contact with connection layer 108 and cut layer 114. Therefore, connection layer 108 may be conductively connected to cut layer 114 through portion 232d. Similarly, portion 232e may be between connection layer 108' and cut layer 114 and in contact with connection layer 108' and cut layer 114. Therefore, connection layer 108' may be conductively connected to cut layer 114 through portion 232e. In this way, connection layers 108 and 108' may be conductively connected with each other through portion 232d, cut layer 114, and portion 232e. Alternatively or additionally, connection layers 108 and 108' may be conductively connected with each other through portions 232d, 232c, and 232e. Because adhesion layer 232, cut layer 114, and source contacts 104 and 104' are all conductive, source contacts 104 and 104', while physically separated by support structure 220, can be conductively connected to each other through any suitable combinations of adhesion portions 232a-232g, cut layer 114, and/or connection layers 108 and 108' that form conductive paths across support structure 220, thereby conductively linking the conductive components on both sides of support structure 220.

In some embodiments, connection layers 108/108', cut layer 114, and/or source contacts 104/104' may include one or more conductive materials, including, for example, at least one of tungsten, cobalt, aluminum, copper, silicide, or polysilicon. For example, in some embodiments, cut layer 114 may include polysilicon. In another example, connection layers 108 and 108' may include tungsten.

In some embodiments, cut layer 114 may include dielectric material(s) such as silicon oxide. In this case, the conductive link across support structure 220 may be established by adhesion layer 232 (e.g., through portion 232c).

In some embodiments, cap layer 115 may be over cut layer 114. Cap layer 115 may include a dielectric material such as silicon oxide. In some embodiments, cap layer 115 may be in contact with cut layer 114. As shown in FIG. 2A, cap layer 115 and cut layer 114 may be between connection layers 108 and 108' and separate connection layers 108 and 108'. In some embodiments, portions 232d and 232e may extend vertically along support structure 220 such that portion 232d is between connection layer 108 and cap layer 115, and portion 232e is between connection layer 108' and cap layer 115. In some embodiments, an upper surface of cap layer 115 and an upper surface of connection layer 108 or 108' may be coplanar. In some embodiments, cap layer 115 may be formed in the same fabrication processes as dielectric cap layer 125 and be part of dielectric cap layer 125, as shown in FIG. 2B.

Support structure 220 may be in contact with portions of stack structure 111 in adjacent block regions 21. In some embodiments, portion stack 221 may include interleaved a plurality of conductor portions 223 and a plurality of insulating portions 224. In some embodiments, each of the plurality of conductor portions 223 may be in contact with a corresponding conductor layer in a memory block in block regions 21 adjacent to the source structure. Each of the plurality of insulating portions may be in contact with a corresponding insulating layer in a memory block in block regions 21 adjacent to the source structure.

In some embodiments, a width d1 of cut layer 114 along the x-direction may be less than a width d2 of the support structure under portion 232c. In some embodiments, support structure 220 includes a spacer layer 225 under cut layer 114 and in contact with the interleaved conductor portions 223 and insulating portions 224 (e.g., surrounding portion stack 221). Spacer layer 225 may include a dielectric material to provide insulation between portion stack 221 and adjacent source contacts 104 and 104'.

At least two source contacts (e.g., 104 and 104') may be consecutively arranged along the x-direction or separately distributed along the x-direction. For example, the at least two source contacts (e.g., 104 and 104') may be separated by one or more other source contacts that are not in contact with a connection layer (e.g., 108/108') and/or adhesion layer 232. In some embodiments, a connection layer may be over and in contact with each of the plurality of source contacts in a source structure. In some embodiments, adhesion layer 232 may conductively connect all source contacts in a source structure. One or more source contacts (e.g., 104, 104') may be applied with a source voltage through the respective connection layer (e.g., 108, 108'). In some embodiments, one or more connection layers (e.g., 108, 108') may include multiple portions. The specific number of portions in connection layer 108/108' should be determined based on the design and/or fabrication of 3D memory device 100 and should not be limited by the embodiments of the present disclosure.

In some embodiments, cut layer 114 includes a suitable material that is different from the sacrificial layers. During the gate replacement process to form conductor layers 123 and conductor portions 223, cut layer 114 may retain from the etching of the sacrificial layers. For example, cut layer 114 may include one or more of tungsten, aluminum, cobalt, copper, polysilicon, and silicide, and sacrificial layers may include silicon nitride. In some embodiments, conductor portions 223 may include the same material as conductor layers 123 in adjacent block regions 21, and insulating portions 224 may include the same material as insulating layers 124 in adjacent block regions 21. For example, conductor portions 223 may include one or more of tungsten, aluminum, cobalt, copper, polysilicon, and silicide, and insulating portions 224 may include one or more of silicon oxide, silicon nitride, and silicon oxynitride. In some embodiments, connection layer 108/108' includes one or more of tungsten, aluminum, cobalt, copper, polysilicon, and silicide. In some embodiments, source contact 104/104' includes polysilicon, and connection layer 108/108' includes tungsten. In some embodiments, dielectric cap layer 125 includes silicon oxide. In some embodiments, adhesion layer 232 may include TiN to improve the adhesion and/or conductivity between connection layer (e.g., 108) and source contact (e.g., 104) and/or between connection layer (e.g., 108) and cut layer 114. In some embodiments, adhesion layer 232 may improve the adhesion between an insulating structure and a conductive structure (e.g., between source contact 104/104' and support structure 220 (or spacer layer 225), between cut layer 114 and portion stack 221 (or spacer layer 225), and between connection layers 108/108' and cap layer 115).

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

FIG. 3A illustrates an exemplary pattern set 300 for forming the etch masks used in the fabrication process. FIG. 3B illustrates an enlarged view of a unit 350 of the pattern set. Patterns in pattern set 300 may be used in different stages of a fabrication process to form 3D memory device 100. In various embodiments, depending on the types of photoresist used in the patterning processes, patterns in pattern set 300 may each be a part of an etch mask or a pattern for determining an etch mask. For example, if a negative photoresist is used for patterning, the patterns in pattern set 300 may be used as a part of etch masks; if a positive photoresist is used for patterning, the patterns in pattern set 300 may be complementary patterns for determining etch masks. It should be noted that the shapes, dimensions, and ratios shown in FIGS. 3A and 3B are for illustrative purposes and are not to scale.

As shown in FIG. 3A, pattern set 300 includes patterns 302, 306, and 308. Specifically, pattern 302 may be used for patterning slit openings of a slit structure, pattern 306 may be used for patterning a cut structure from which cut layer 114 is formed, and pattern 308 may be used for forming contact plugs connecting connection layer 108/108' and a peripheral circuit. Pattern set 300 may include a plurality of repeating units for the formation of a cut structure, the slit openings, and connection layer 108. FIG. 3B illustrates a repeating unit 350 that shows the details, e.g., coverage, of each pattern. As shown in FIG. 3B, along the x-direction, a length D1 of pattern 306 (for forming the cut structure) may be less than, equal to, or greater than a length D2 of pattern 302 (for forming slit openings). For example, if the cut structure is employed as an etch mask to form the slit openings, length D1 may be less than, greater than, or equal to length D2, and a width W1 of pattern 306 may be greater than a width W2 of pattern 302; if a separate etch mask (e.g., pattern 302) is employed as an etch mask to form the slit openings, length D1 may be greater than or equal to length D2 and width W1 may be less than, equal to, or greater than width W2. In some embodiments, D1>D2 and W1<W2. The combination of D1, D2, W1, and W2 in patterns 306 and 302 may ensure the cut structure (or support structure 220) is in contact with adjacent block regions 21 and have desired dimensions in x-y plane, and should not be limited by the embodiments of the present disclosure.

Figure 4B:
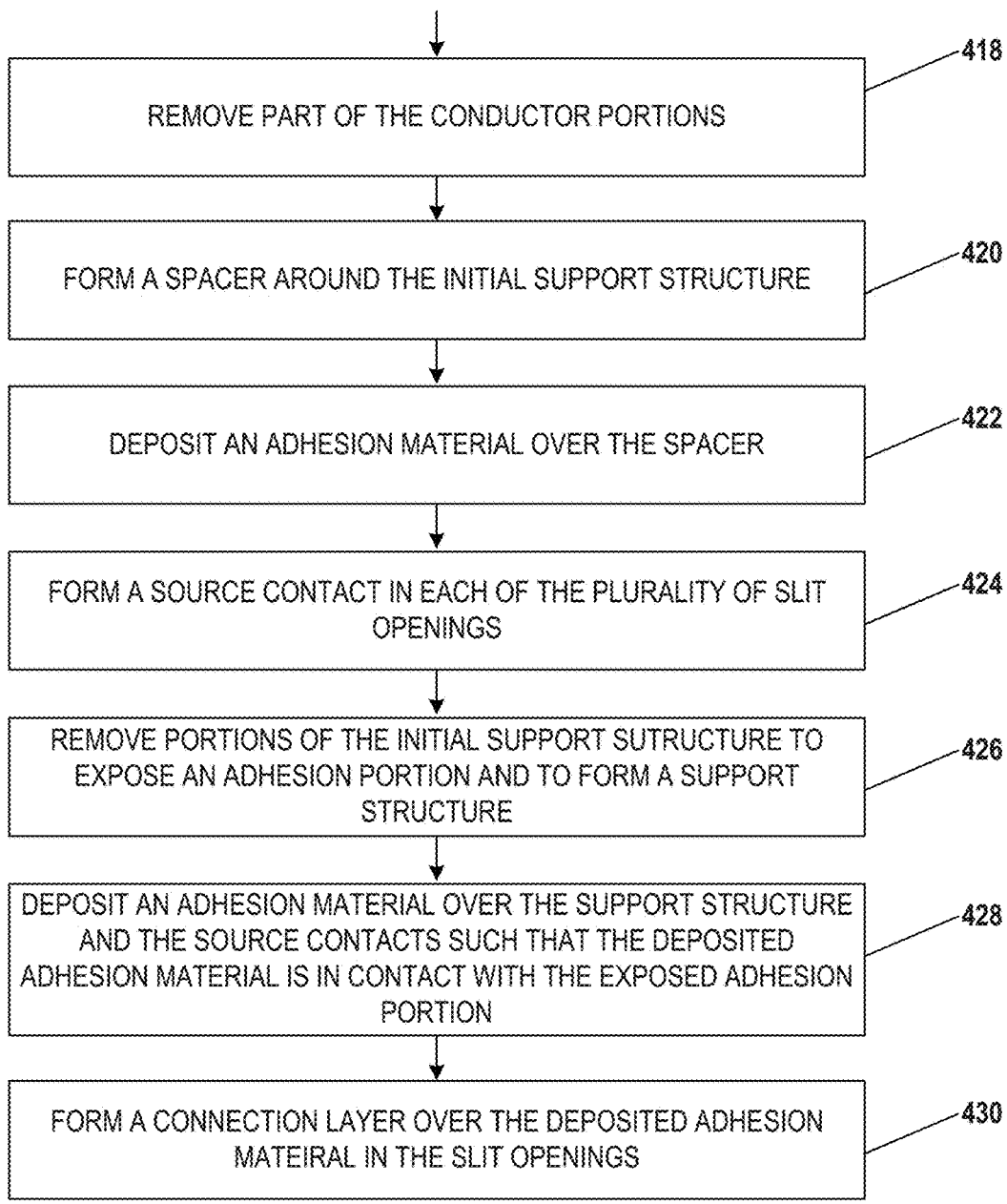

FIGS. 4A and 4B illustrate a flowchart of an exemplary fabrication process 400 to form 3D memory device 100, and FIGS. 5-20 illustrate the fabrication process 400, according to some embodiments. FIGS. 4A and 4B will be discussed together with FIGS. 5-20 to describe the fabrication process. As shown in FIGS. 4A and 4B, fabrication process 400 includes operations 402-430. Some of the operations may be omitted, and the operations may be performed in a different order than the one shown in FIGS. 4A and 4B. Some operations may be performed simultaneously (e.g., in the same operation(s) of the fabrication process).

Figure 5:
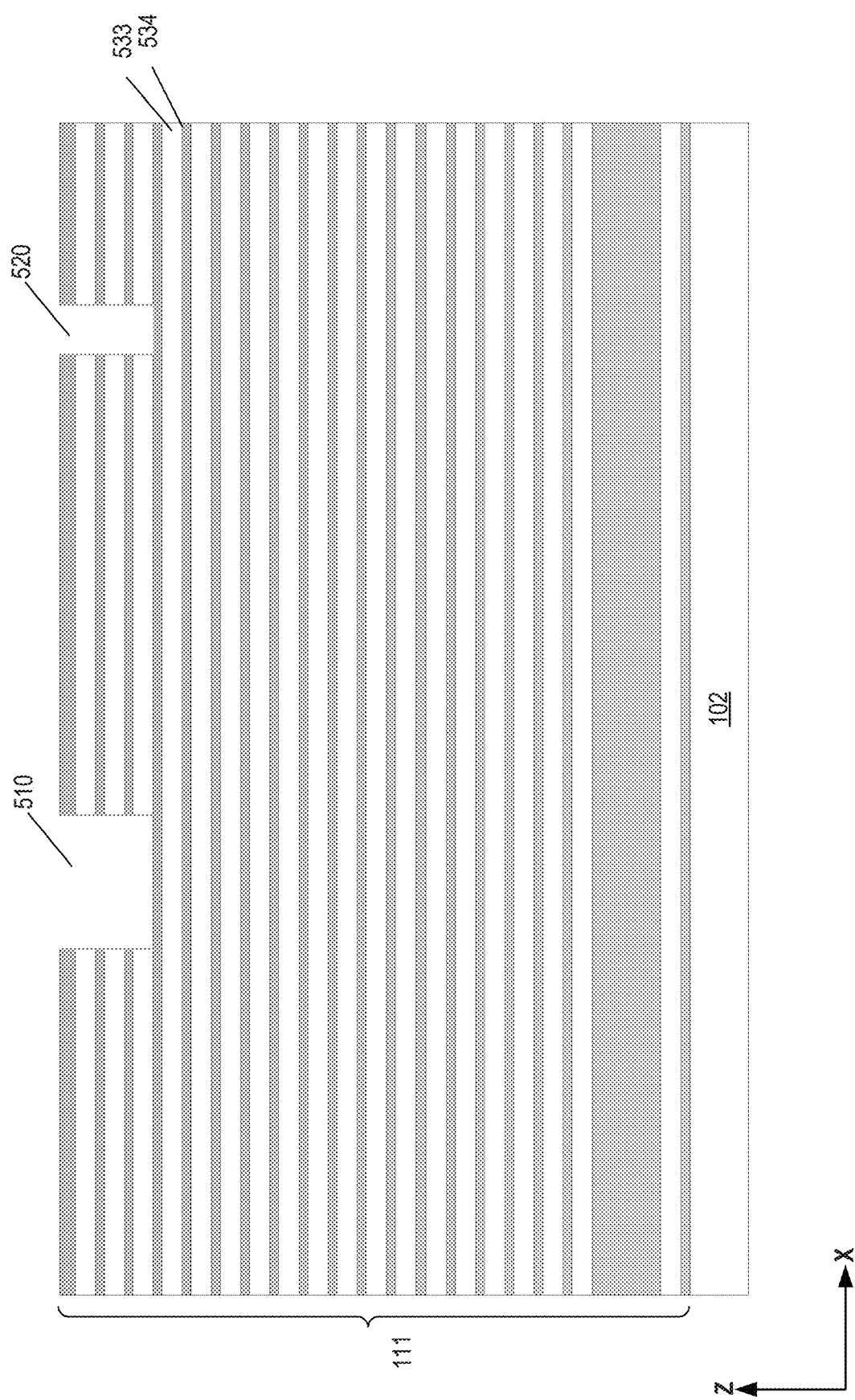
FIGS. 5-20 illustrate cross-sectional views of an exemplary 3D memory device at various stages of a fabrication process, according to some embodiments of the present disclosure.

At operation 402, one or more cut openings are formed in a stack structure. FIG. 5 illustrates an exemplary cut opening 510 formed in an exemplary stack structure 111. Stack structure 111 may have a dielectric stack of interleaved initial sacrificial layers 533 and initial insulating layers 534 formed over a substrate 102. Initial sacrificial layers 533 may be used for subsequent formation of conductor layers 123. Initial insulating layers 534 may be used for subsequent formation of insulating layers 124. In some embodiments, stack structure 111 includes a first dielectric cap layer on the top surface of stack structure 111.

Stack structure 111 may have a staircase structure. The staircase structure can be formed by repetitively etching a material stack that includes a plurality of interleaved sacrificial material layers and insulating material layers using an etch mask, e.g., a patterned PR layer over the material stack. The interleaved sacrificial material layers and the insulating material layers can be formed by alternatingly depositing layers of sacrificial material and layers of insulating material over substrate 102 until a desired number of layers is reached. The sacrificial material layers and insulating material layers can have the same or different thicknesses. In some embodiments, a sacrificial material layer and the underlying insulating material layer are referred to as a dielectric pair. In some embodiments, one or more dielectric pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the sacrificial material layer and the underlying insulating material layer. The etched sacrificial material layers and insulating material layers may form initial sacrificial layers 533 and initial insulating layers 534. The PR layer can then be removed.

The insulating material layers and sacrificial material layers may have different etching selectivities during the subsequent gate-replacement process. In some embodiments, the insulating material layers and the sacrificial material layers include different materials. In some embodiments, the insulating material layers include silicon oxide, and the deposition of insulating material layers include one or more of chemical vapor deposition (CVD), atomic layer deposition (ALD), physical vapor deposition (PVD), and sputtering. In some embodiments, the sacrificial material layers include silicon nitride, and the deposition of insulating material layers include one or more of CVD, PVD, ALD, and sputtering. In some embodiments, the etching of the sacrificial material layers and the insulating material layers include one or more suitable anisotropic etching process, e.g., dry etch.

Referring to FIG. 5, cut opening 510 may be formed in source region 22 (FIG. 1). Pattern 306 may be used for patterning cut opening 510. The depth of cut opening 510 may be between the thicknesses of two initial sacrificial/insulating layer pairs and four initial sacrificial/insulating layer pairs. The depth value of cut opening 510 is determined based on design and/or fabrication of 3D memory device 100 and should not be limited by the embodiments of the present disclosure. In some embodiments, an anisotropic etching process, such as dry etch, is performed to remove a portion of stack structure 111 until a desired depth is reached. In some embodiments, one or more selective etching processes are used to remove the portion of stack structure 111 so the bottom surface of cut opening 510 can stop at a desired position (e.g., on a top surface of a desired initial insulating layer 534 or initial sacrificial layer 533) along the z-direction. In some embodiments, cut opening 510 may be formed in the same operations as forming other structures in stack structure 111, such as an opening 520 for forming a top select gate (TSG) cut. Therefore, no extra operation is need to form the cut opening 510.

Figure 6:
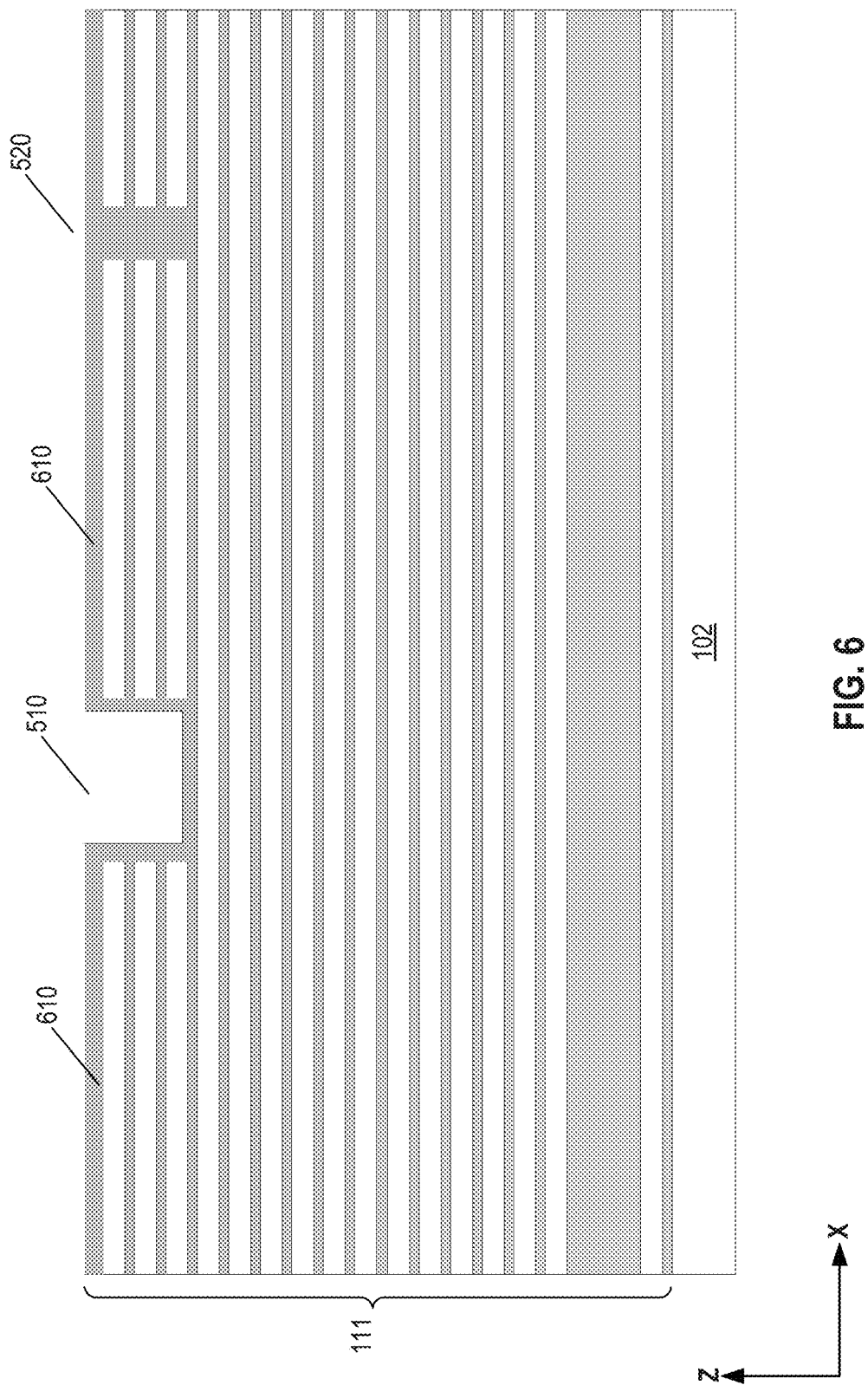

At operation 404, a suitable dielectric material, such as silicon oxide, is deposited in the cut opening. FIG. 6 illustrates an exemplary dielectric material 610 that is deposited in cut opening 510. A suitable deposition process, such as CVD, ALD, PVD, sputtering, or a combination thereof, can be performed to deposit the dielectric material. In some embodiments, dielectric material 610 is deposited by ALD. Optionally, a planarization process, e.g., CMP and/or recess etch, is performed to remove any excess material over stack structure 111. In some embodiments, cut opening 510 is sufficiently large in size that dielectric material 610 is not filled up cut opening 510. On the other hand, opening 520, which is smaller than cut opening 510, is filled up with dielectric material 610 to form the TSG cut.

Figure 7:
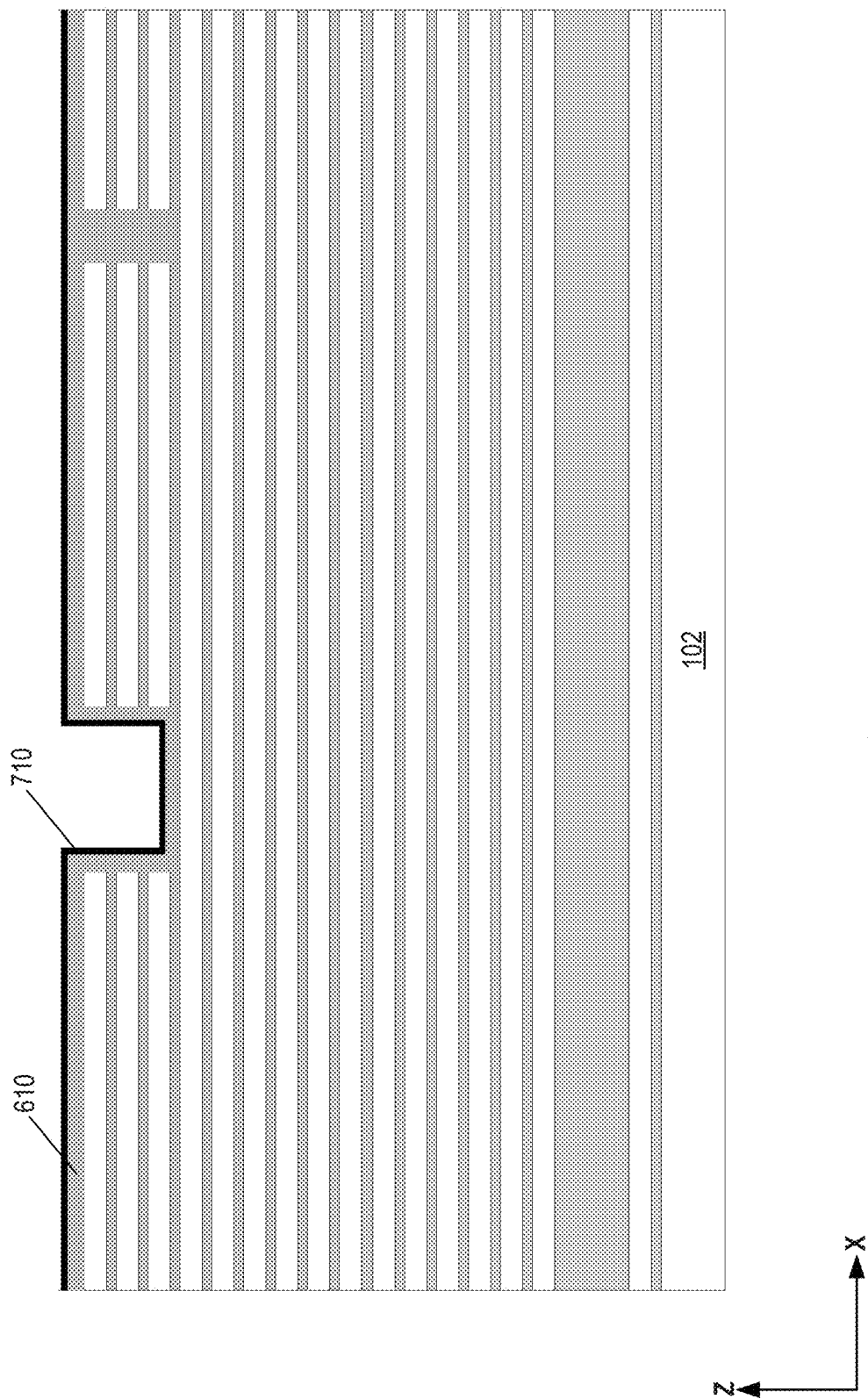

At operation 406, an adhesion material is deposited over the dielectric material. FIG. 7 shows an exemplary adhesion material 710 deposited over dielectric material 610. Adhesion material 710 may include, for example, Ti and/or TiN. In some embodiments, adhesion material 710 includes TiN.

Figure 8:
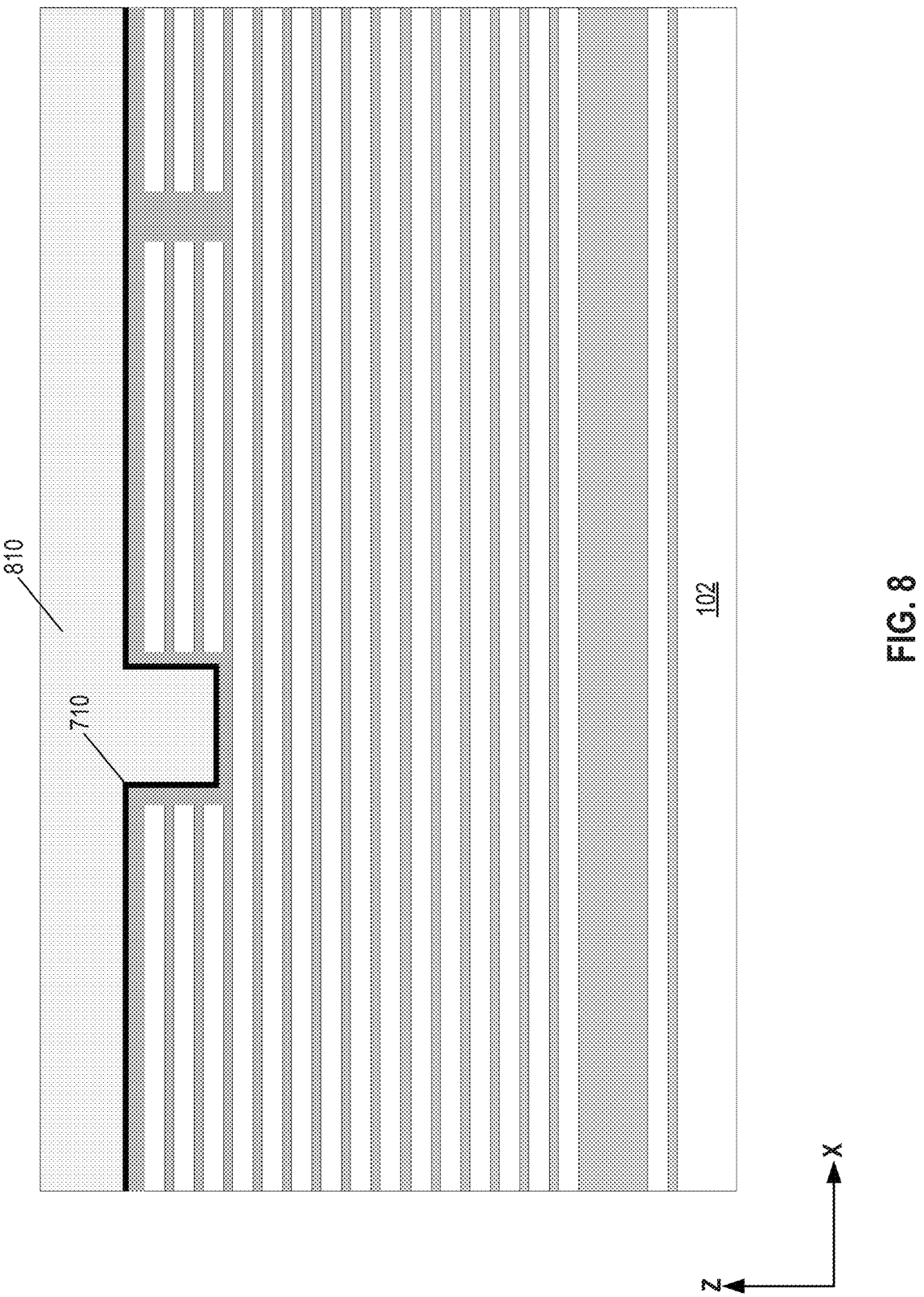

At operation 408, a conductive material is deposited over the adhesion material. FIG. 8 shows an exemplary conductive material 810 deposited over adhesion material 710. Conductive material 810 may include at least one of tungsten, cobalt, aluminum, copper, silicide, or polysilicon. In some embodiments, conductive material 810 may include polysilicon. Any suitable deposition method can be used to deposit conductive material 810 over adhesion material 710.

Figure 9:
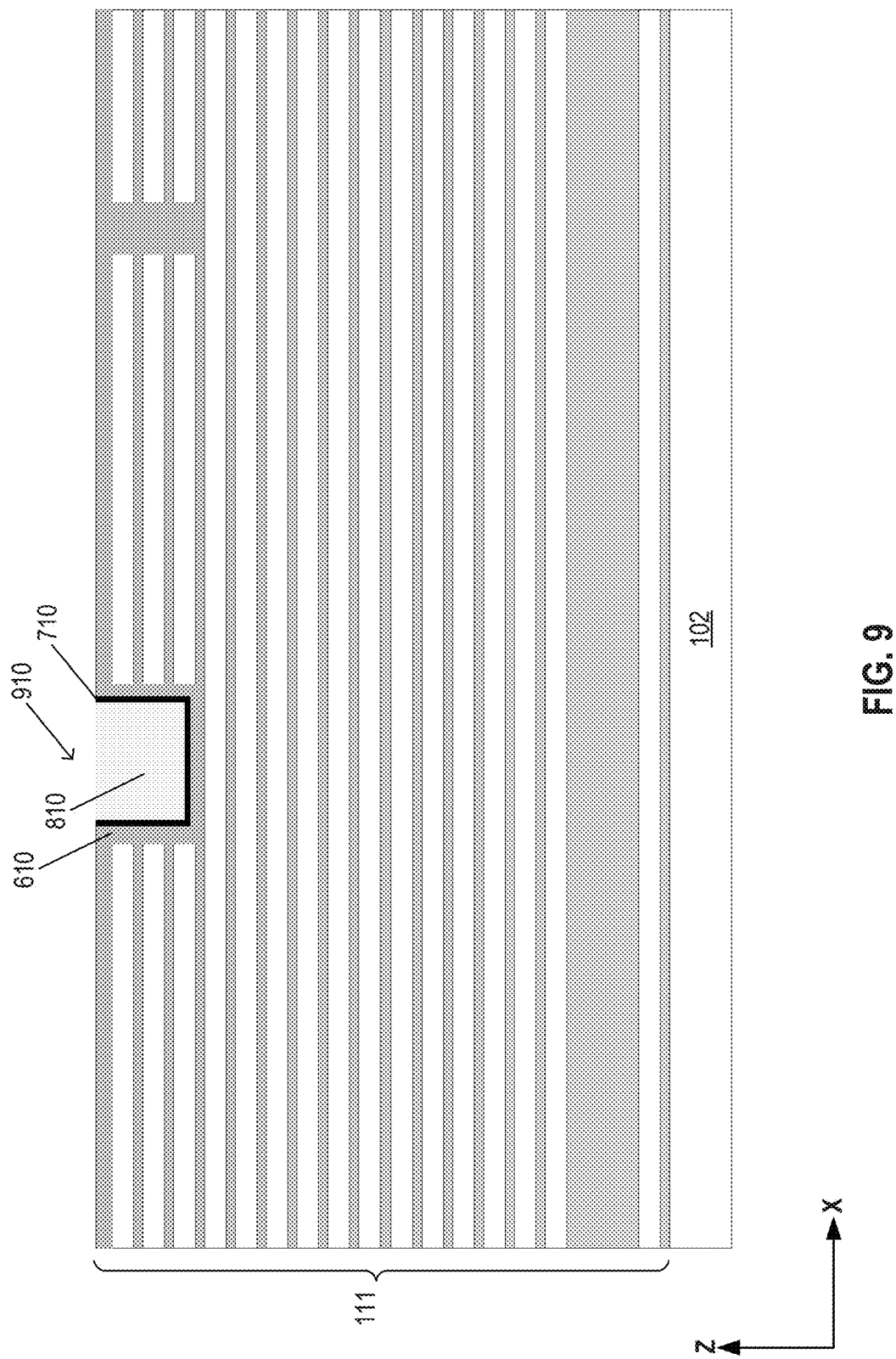

At operation 410, part of the deposited conductive material and part of the deposited adhesion material are removed to form a cut structure. For example, a planarization process, e.g., CMP and/or recess etch, is performed to remove any excess conductive material and adhesion material. FIG. 9 shows stack structure 111 after the excess conductive material and adhesion material are removed. A cut structure 910 is formed, which includes the remaining parts of dielectric material 610, adhesion material 710, and conductive material 810 that fill up the cut opening 510 (FIG. 5).

A plurality of channel structures 110 (FIG. 1) can be formed in block region 21 (FIG. 1) before or after the formation of cut structure 910. Channel structures 110 may be formed before the formation of conductor layers 123. As an example, channel structures 110 are formed before the formation of cut structure 910. To form channel structures 110, a plurality of channel holes may be formed extending vertically through stack structure 111. In some embodiments, a plurality of channel holes are formed through the interleaved initial sacrificial layers 533 and initial insulating layers 534. The plurality of channel holes may be formed by performing an anisotropic etching process, using an etch mask such as a patterned PR layer, to remove portions of stack structure 111 and expose substrate 102. In some embodiments, at least one channel hole is formed on each side of cut structure 910 along the y-direction. In some embodiments, a plurality of channel holes are formed in each block region 21. A recess region may be formed at the bottom of each channel hole to expose a top portion of substrate 102 by the same etching process that forms the channel hole above substrate 102 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as the epitaxial portion. Optionally, a recess etch (e.g., dry etch and/or wet etch) may be performed to remove excess semiconductor material on the sidewall of the channel hole and/or control the top surface of the epitaxial portion at a desired position. In some embodiments, the top surface of the epitaxial portion is located between the top and bottom surfaces of the bottom initial insulating layer 534.

In some embodiments, the channel holes are formed by performing a suitable etching process, e.g., an anisotropic etching process (e.g., dry etch) and/or an isotropic etching process (wet etch). In some embodiments, the epitaxial portion includes single crystalline silicon is formed by epitaxially grown from substrate 102. In some embodiments, the epitaxial portion includes polysilicon formed by a deposition process. The formation of epitaxially-grown epitaxial portion can include, but not limited to, vapor-phase epitaxy (VPE), liquid-phase epitaxy (LPE), molecular-beam epitaxy (MPE), or any combinations thereof. The formation of the deposited epitaxial portion may include, but not limited by, CVD, PVD, and/or ALD.

In some embodiments, a semiconductor channel is formed over and in contact with the epitaxial portion in the channel hole. Semiconductor channel can include a channel-forming structure that has a memory film (e.g., including a blocking layer, a memory layer, and a tunneling layer), a semiconductor layer formed above and connecting the epitaxial portion, and a dielectric core filling up the rest of the channel hole. In some embodiments, memory film is first deposited to cover the sidewall of the channel hole and the top surface of the epitaxial portion, and a semiconductor layer is then deposited over memory film and above epitaxial portion. The blocking layer, memory layer, and tunneling layer can be subsequently deposited in this order using one or more thin film deposition processes, such as ALD, CVD, PVD, any other suitable processes, or any combination thereof, to form memory film. The semiconductor layer can then be deposited on the tunneling layer using one or more thin film deposition processes, such as ALD, CVD, PVD, any other suitable processes, or any combination thereof. In some embodiments, a dielectric core is filled in the remaining space of the channel hole by depositing dielectric materials after the deposition of the semiconductor layer, such as silicon oxide.

In some embodiments, a drain structure is formed in the upper portion of each channel hole. In some embodiments, parts of memory film, semiconductor layer, and dielectric core on the top surface of stack structure 111 and in the upper portion of each channel hole can be removed by CMP, grinding, wet etching, and/or dry etching to form a recess in the upper portion of the channel hole so that a top surface of semiconductor channel may be between the top surface and the bottom surface of the first dielectric cap layer. Drain structure then can be formed by depositing conductive materials, such as metals, into the recess by one or more thin film deposition processes, such as CVD, PVD, ALD, electroplating, electroless plating, or any combination thereof. A channel structure 110 is thereby formed. A plurality of memory cells may subsequently be formed by the intersection of the semiconductor channels and the control conductor layers. Optionally, a planarization process, e.g., dry/wet etch and/or CMP, is performed to remove any excess material on the top surface of stack structure 111.

Figure 10:
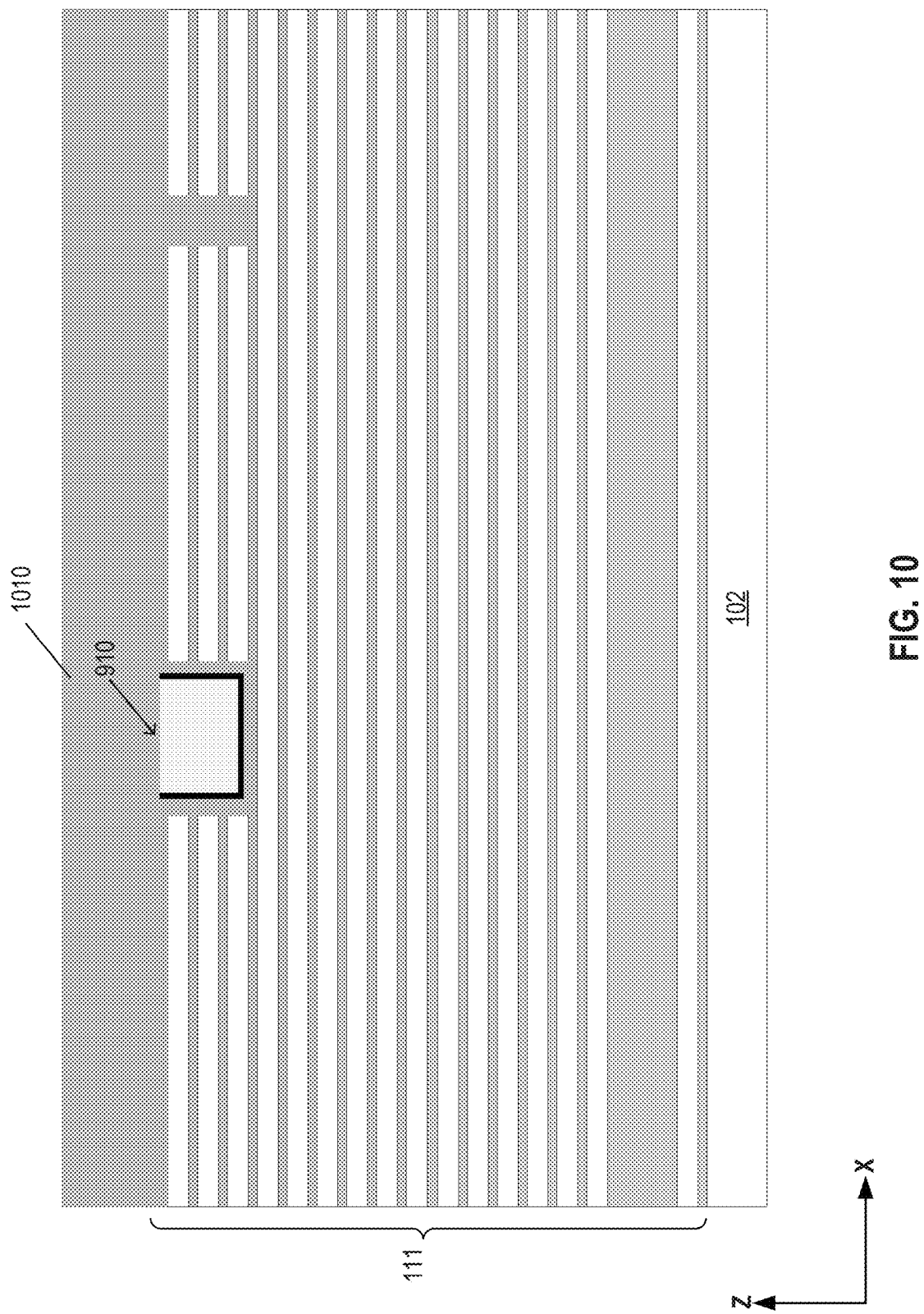

Referring back to FIG. 4A, after the formation of the cut structure, a cap material is deposited over the cut structure and the stack structure in operation 412. FIG. 10 shows a cap material 1010 deposited over cut structure 910 and stack structure 111. Cap material 1010 may include any suitable dielectric material, such as silicon oxide, and can be deposited using processes such as CVD, ALD, PVD, sputtering, or a combination thereof.

Figure 11:
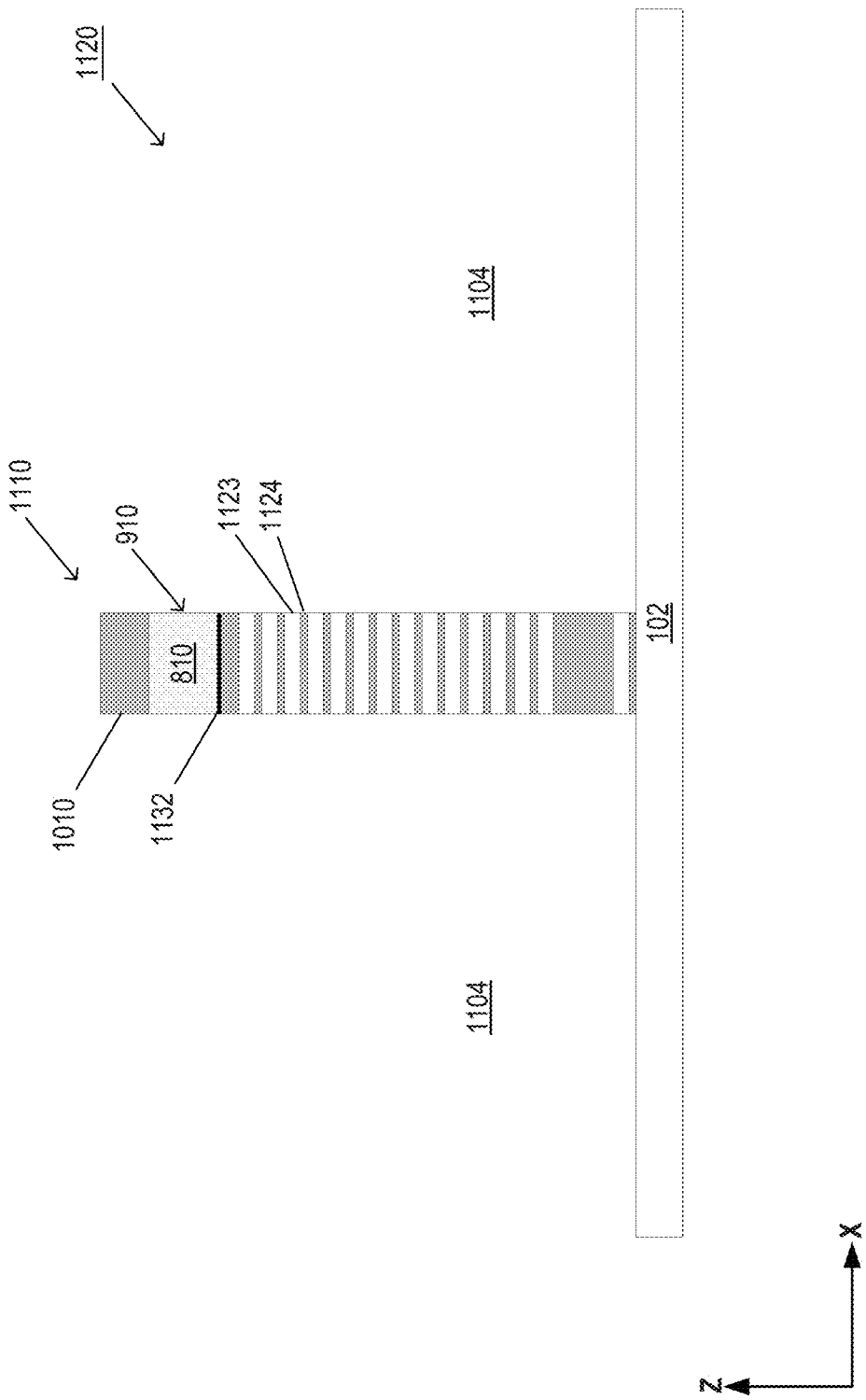

In operation 414, portions of the deposited cap material and portions of the stack structure adjacent to the cut structure are removed to form a slit structure and at least one initial support structure dividing the slit structure into a plurality of slit opening. FIG. 11 shows an exemplary initial support structure 1110 including the remaining part of cap material 1010, the remaining part of cut structure 910, and interleaved a plurality of sacrificial portions 1123 and a plurality of insulating portions 1104. The remaining part of adhesion material, referred to as 1132, is between the remaining part of conductive material 810 and interleaved plurality of sacrificial portions 1123 and insulating portions 1124. Adhesion material 1132 extends through initial support structure 1110 and can be used as a conductive link to connect component on both sides of initial support structure 1110.

As shown in FIG. 11, portions of stack structure 111 adjacent to cut structure 910, together with any cap material deposited thereover, are removed to form slit structure 1120, which is divided by initial support structure 1110 into slit openings 1104. Pattern 302 may be used for patterning slit structure 1120. That is, portions of stack structure 111 in source region 22 and adjacent to cut structure 910 are removed to form slit structure 1120. The remaining portion of cap material 1010, the remaining portion of cut structure 910, and the underneath interleaved sacrificial portions 1123 and insulating portions 1124 (e.g., remaining portions of initial sacrificial layer 533 and initial insulating layer 534 after the etching of slit structure 1120) may form the initial support structure 1110. The sacrificial portions 1123 and insulating portions 1124 may each be in contact with the sacrificial layers and insulating layers 124 of the same level in adjacent block regions 21. One or more initial support structures may divide slit structure 1120 into a plurality of slit openings 1104, each exposing substrate 102 and interleaved sacrificial layers and insulating layers of adjacent block regions 21. A suitable anisotropic etching process, e.g., dry etch, can be performed to form slit structure 1120.

In some embodiments, pattern 302 may not be used for patterning slit structure 1120 and cut structure 910 may be used as an etch mask to remove portions of stack structure 111 and form slit structure 1120.

Figure 12:
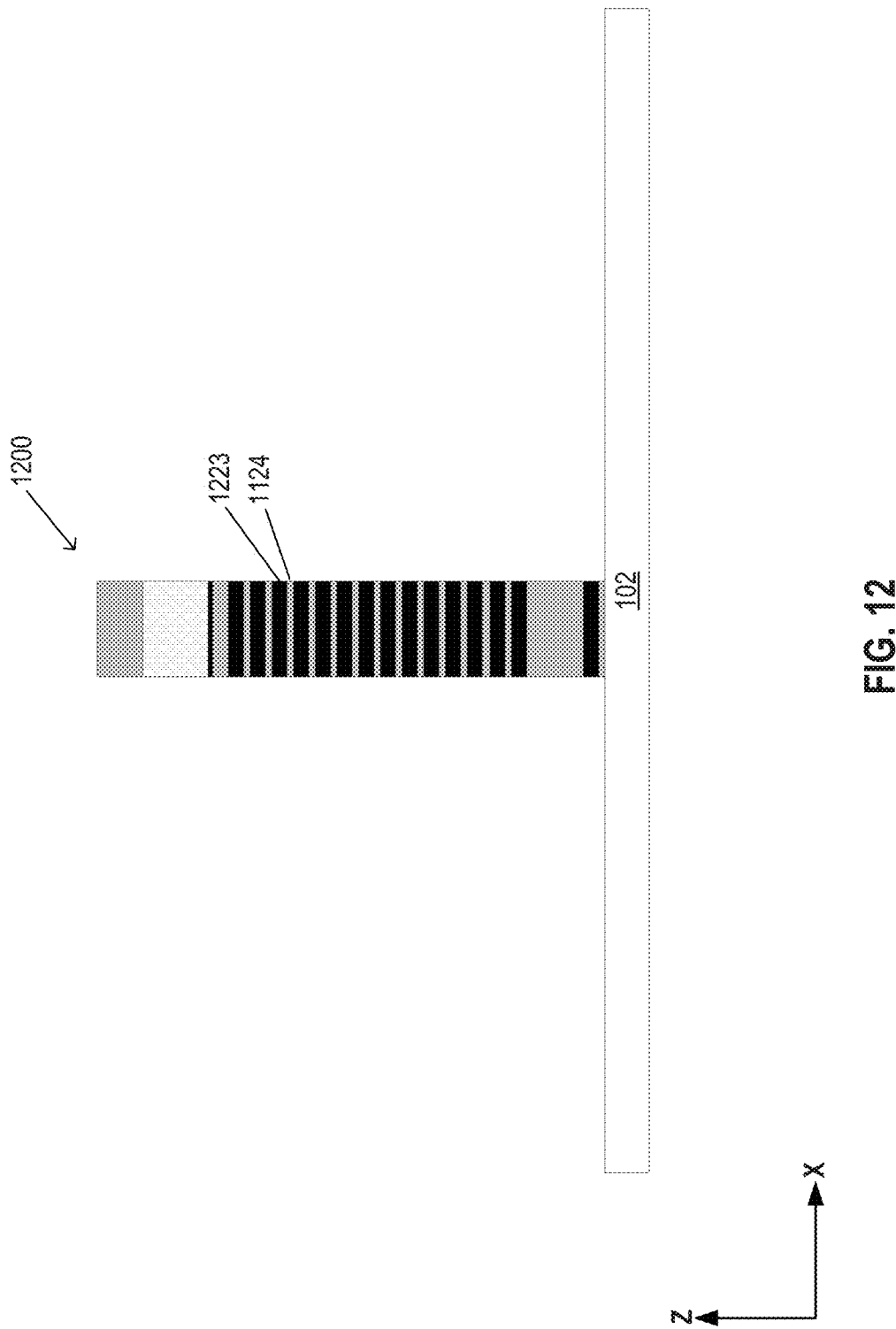

Referring back to FIG. 4A, in operation 416, the sacrificial portions 1123 in each initial support structure and the sacrificial layers in each block region are replaced with conductor portions and conductor layers, forming a portion stack in each initial support structure and a plurality of memory blocks. FIG. 12 illustrates an exemplary structure 1200 after operation 416.

As shown in FIG. 12, the sacrificial portions in each initial support structure are replaced with a plurality of conductor portions 1223. The sacrificial layers in each block region 21 are replaced with a plurality of conductor layers 123 (referring back to FIG. 2B). An isotropic etching process, e.g., wet etch, can be performed to remove the sacrificial portions and sacrificial layers through slit openings 1104. A plurality of lateral recesses may be formed in each block region 21 by the removal of the sacrificial layers, and a plurality of recess portions may be formed in each initial support structure by the removal of the sacrificial portions. A conductor material may then be deposited to fill up the lateral recesses and recess portions, forming the plurality of conductor layers 123 in each block region and the plurality of conductor portions 1223 in each initial support structure.

Figure 13:
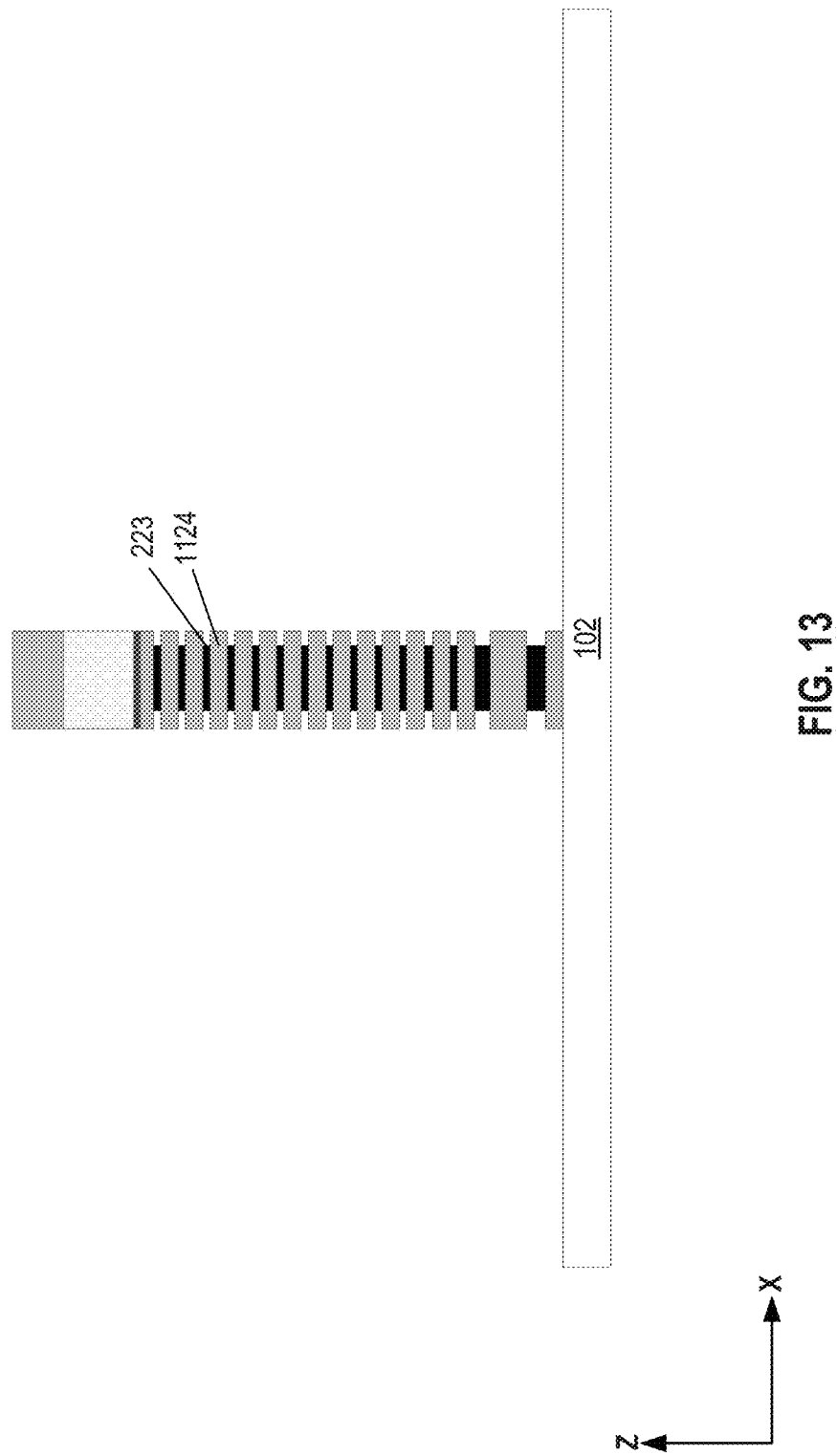
Figure 14:
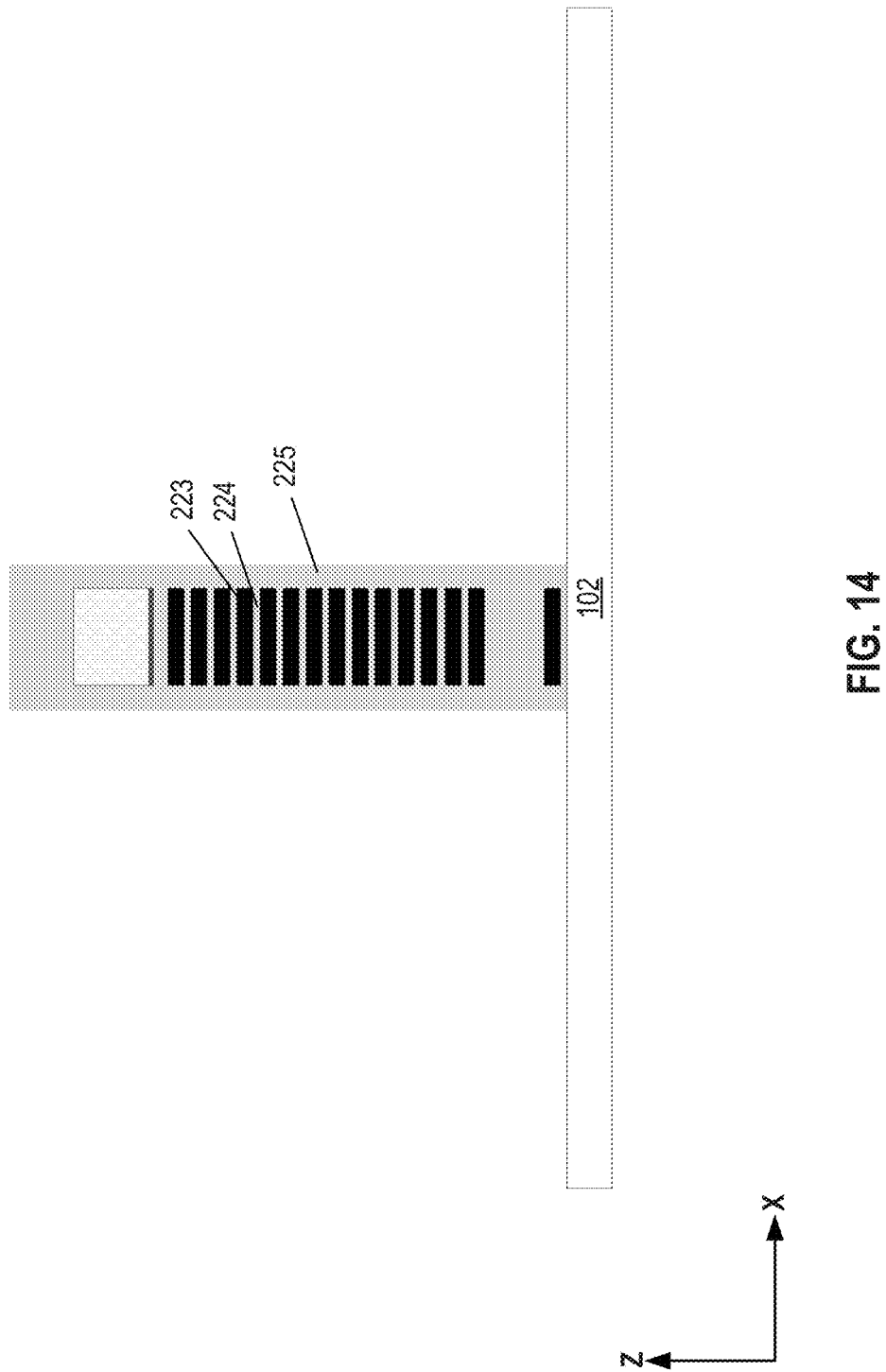

Referring to FIG. 4B, in operation 418, part of the conductor portions is removed. FIG. 13 shows conductor portions 223 after the distal parts of conductor portions 1223 are removed by any suitable process, such as etching. A recess portion is formed on both sides of a conductor portion 223. In operation 420, a spacer layer is formed around the initial support structure. FIG. 14 shows an exemplary spacer layer 225 surrounding the initial support structure. Spacer layer 225 may include a dielectric material and may be deposited by at least one of CVD, PVD, ALD, and sputtering. In addition, portion stack 221, having a plurality of interleaved conductor portions 223 and insulating portions 224, may be formed.

Figure 15:
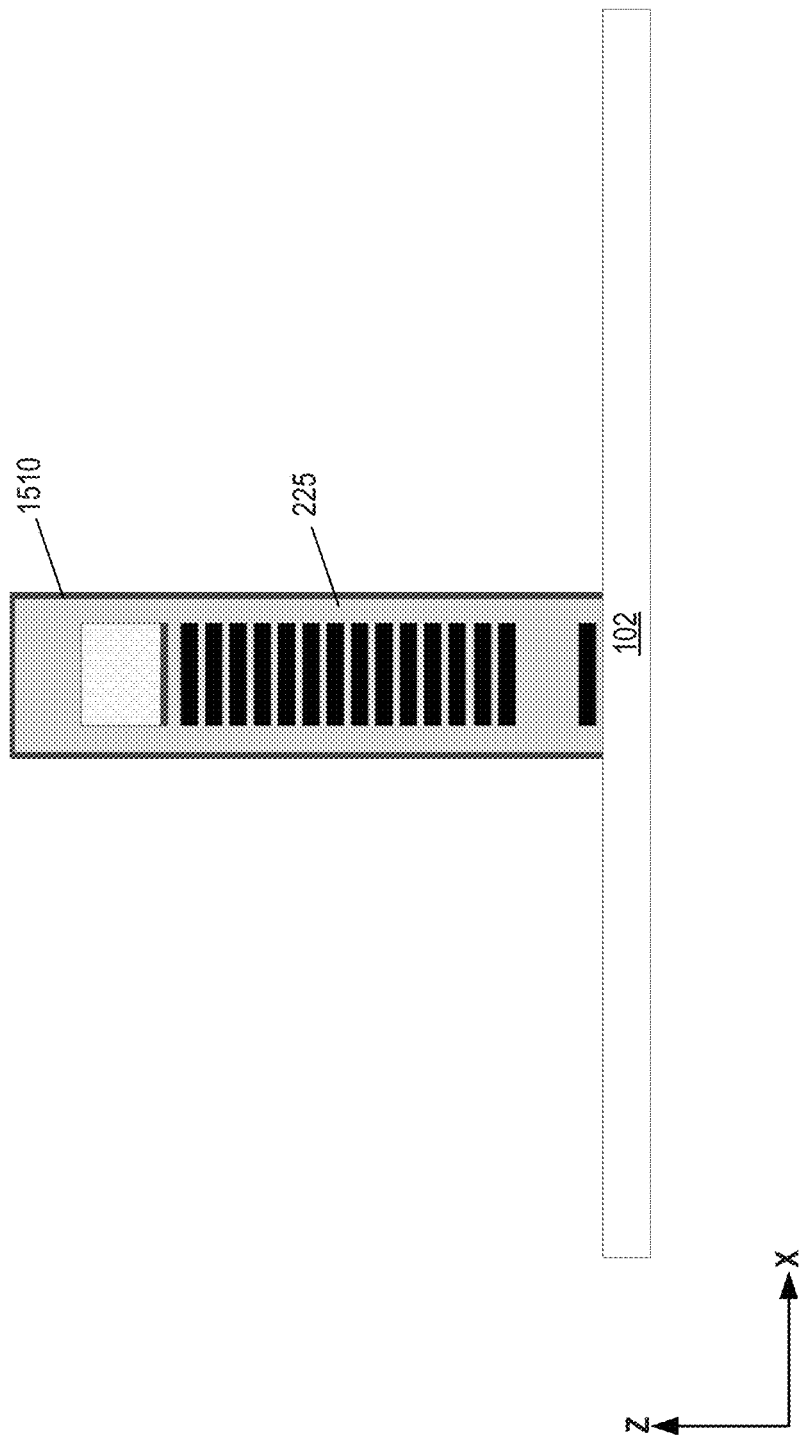
Figure 16:
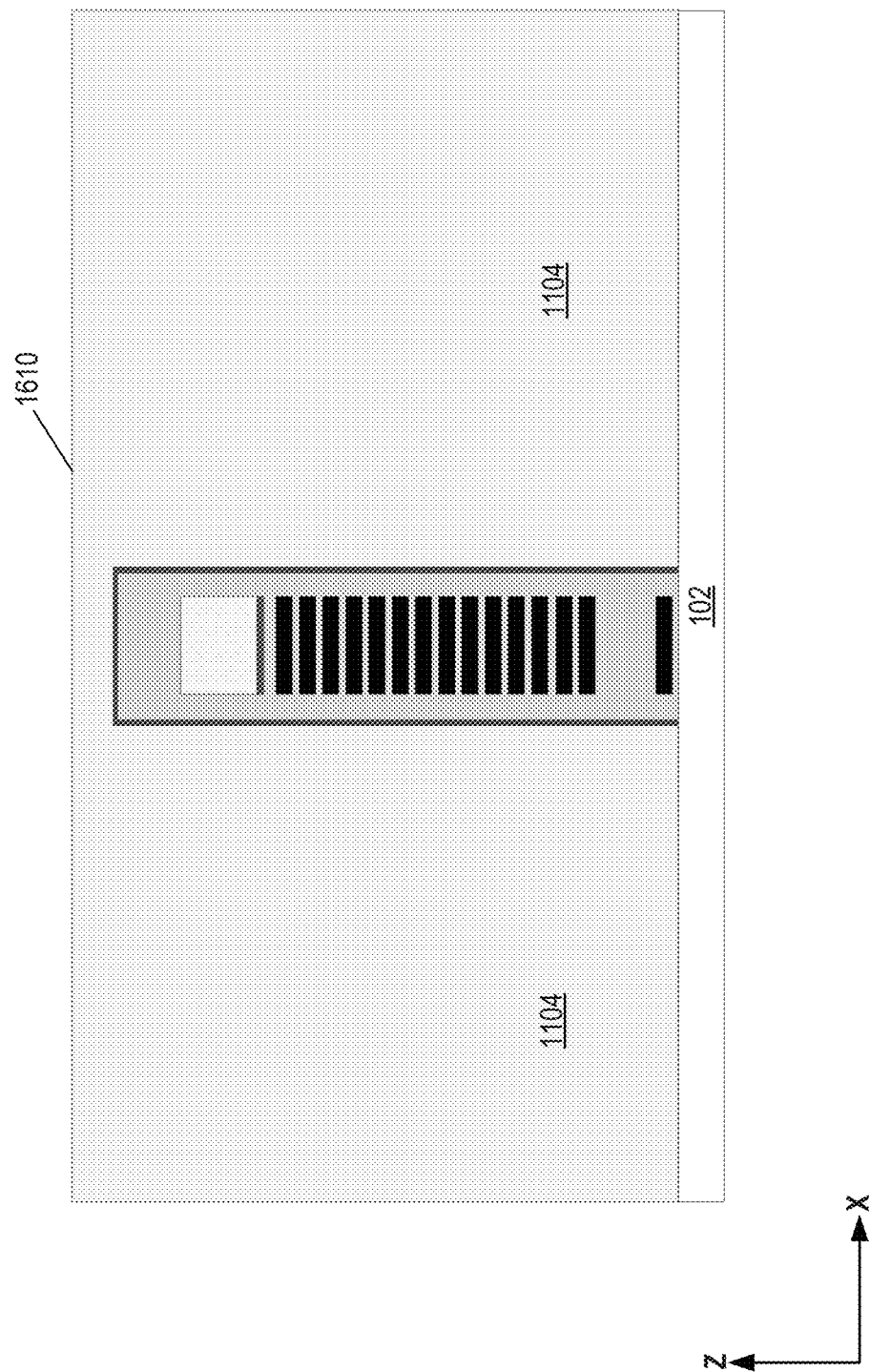
Figure 17:
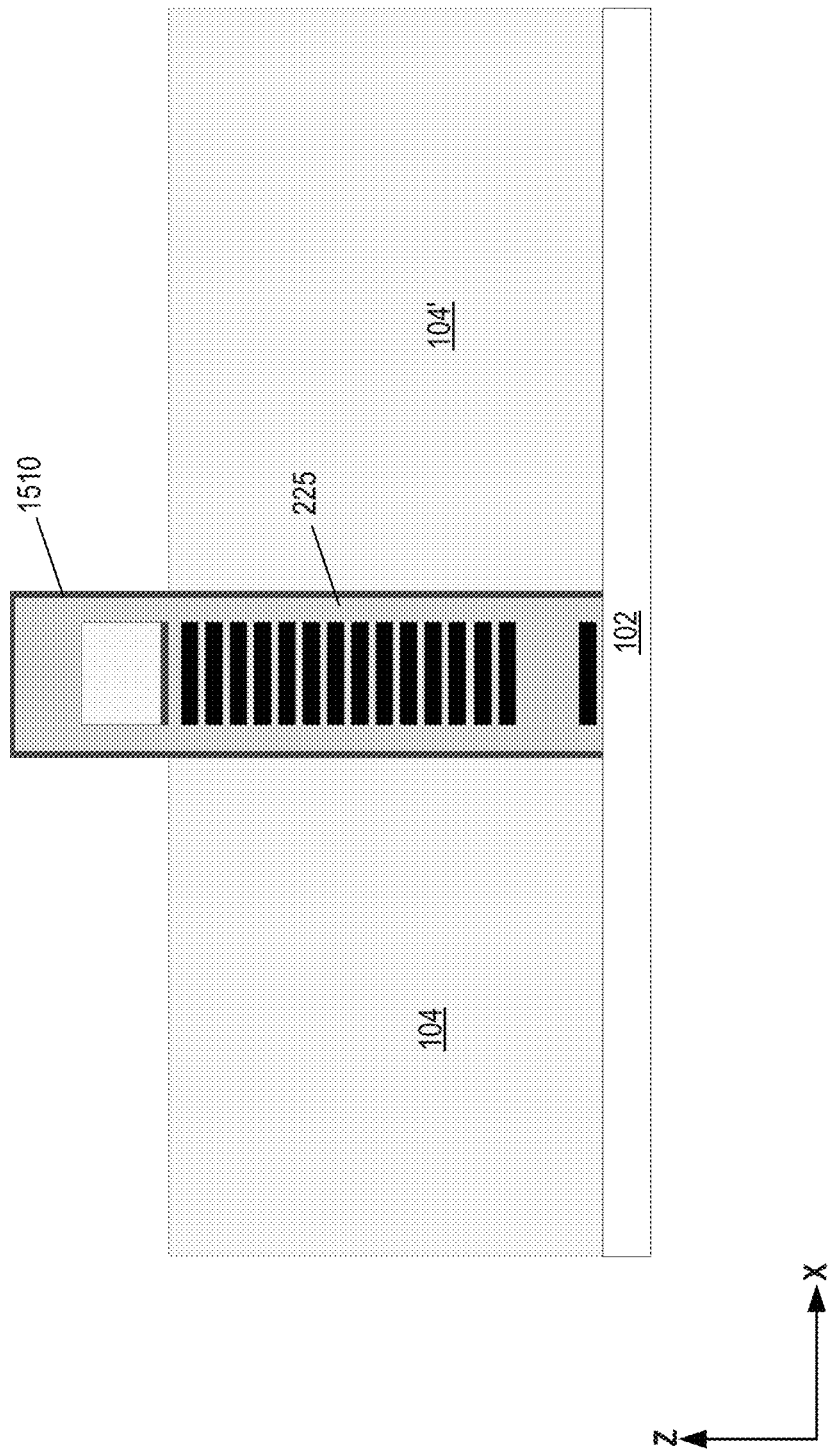

In operation 422, an adhesion material is deposited over the spacer layer. FIG. 15 shows an exemplary adhesion layer 1510 deposited on top of spacer layer 225. Part of adhesion layer 1510 may be used to improve adhesion between the support structure and source contacts, as well as providing a conductive link connecting the conductive components separated by the support structure. In operation 424, one or more source contacts are formed, each in a corresponding slit opening. FIG. 16 shows the deposition of a conductive material 1610 into slit openings 1104. FIG. 17 shows that excess conductive materials are removed, forming source contacts 104/104' in their respective slit openings. Source contacts 104/104' are adhered to spacer layer 255 by part of adhesion layer 1510.

Figure 18:
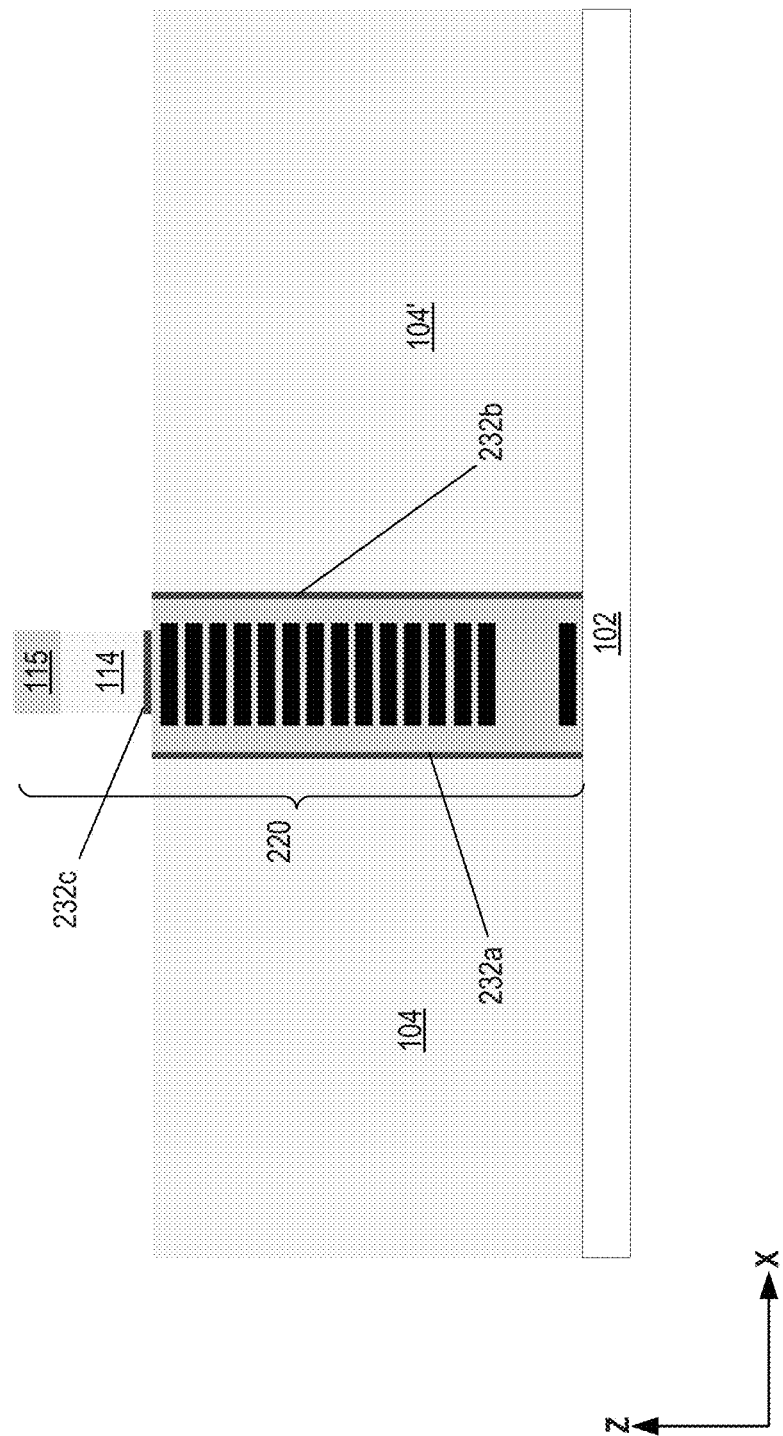

In operation 426, portions of the initial support structure are removed to expose an adhesion portion and to form a support structure. FIG. 18 shows the support structure 220 after both sides of the upper portion of initial support structure are removed. The remaining part of the cap material becomes cap layer 115. The remaining part of the conductive material becomes cut layer 114. Adhesion material 1132, previously surrounded by spacer layer 225, is exposed to the remaining slit openings above source contacts 104 and 104', and becomes portion 232c. Portion 232c may form part of the adhesion layer 232 and function as the conductive link across support structure 220. In addition, the remaining portions of adhesion layer 1510 become portions 232a and 232b.

Figure 19:
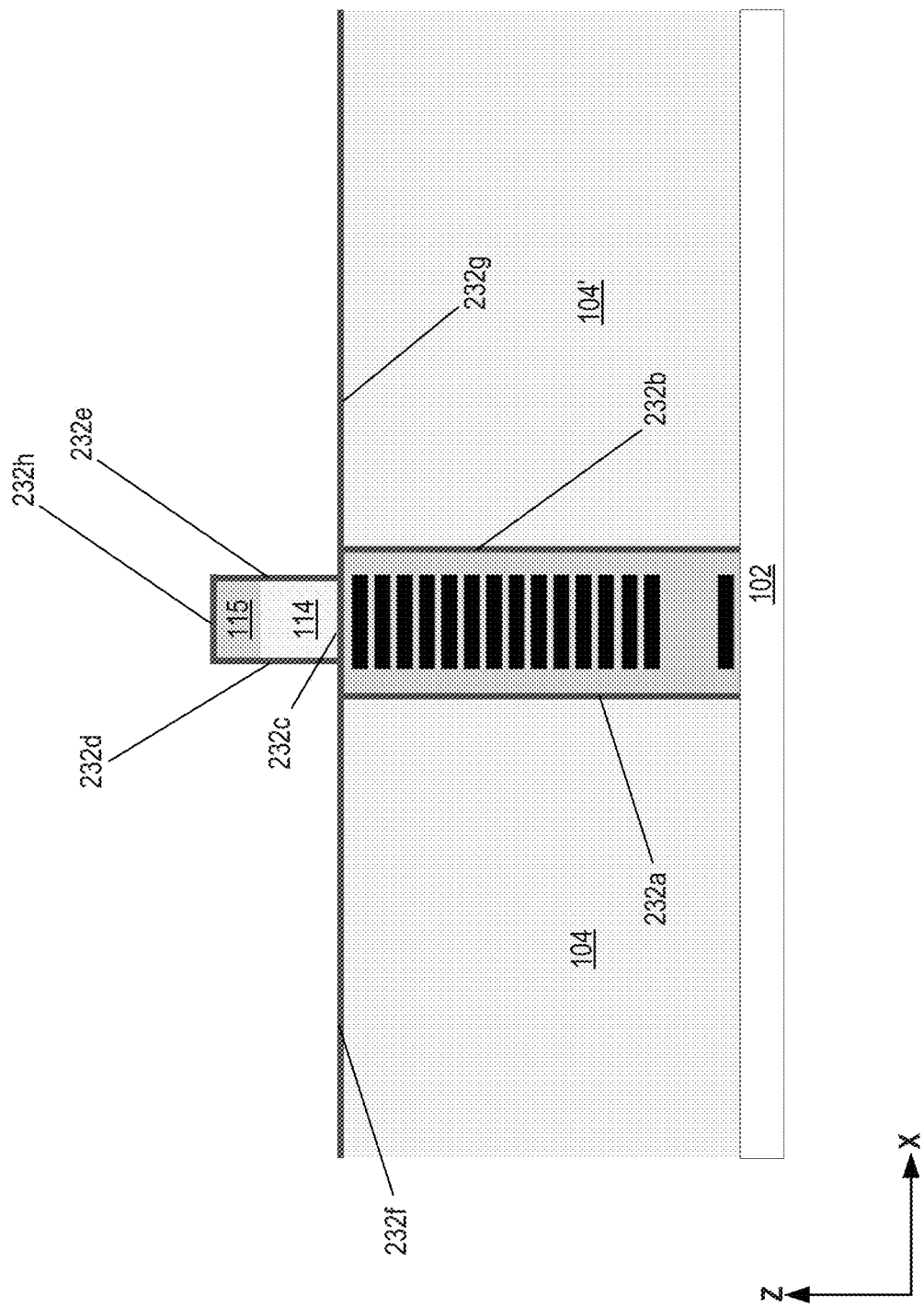

In operation 428, an adhesion material may be further deposited over the support structure and the source contacts such that the deposited adhesion material is in contact with the exposed adhesion portion. FIG. 19 shows an exemplary adhesion layer including portions 232a-232g after adhesion material is deposited at portions 232f, 232d, 232h, 232e, and 232g. Portions 232f, 232d, 232e, and 232g may be in contact with portion 232c. In this way, a conductive link between source contacts 104 and 104' can be established through portions 232a-232g of the adhesion layer.

Figure 20:
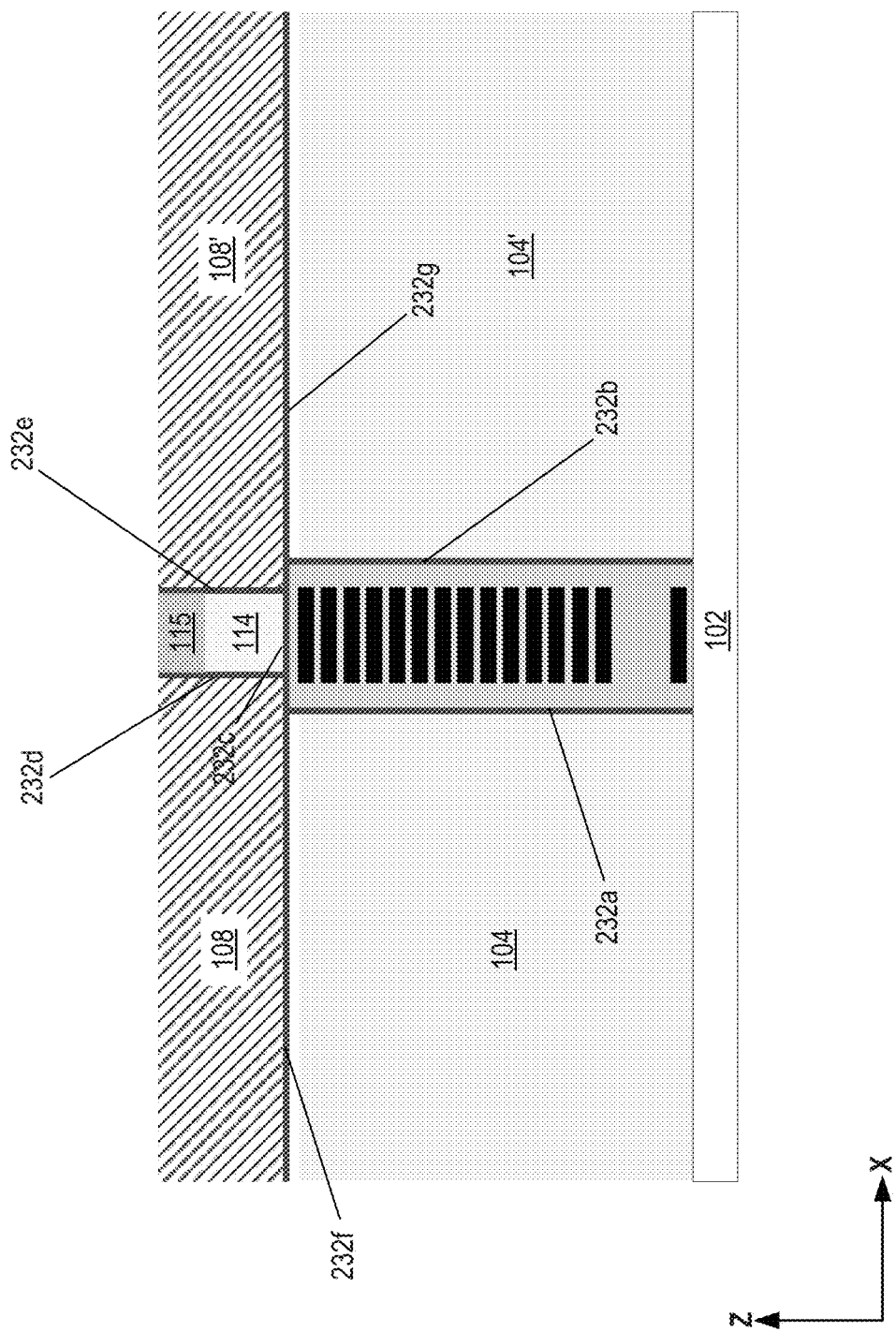

In operation 430, a connection layer is formed over the deposited adhesion material in the slit openings. FIG. 20 shows the structure of 3D memory device 100 after connection layers 108 and 108' are formed and excess portions, including portion 232h of the adhesion layer, are removed. A planarization process, e.g., CMP and/or recess etch, may be used such that the top surface of cap layer 115 and the top surfaces of connection layers 108/108' are coplanar.

After the formation of the support structure and conductor layers, a source structure is formed in the slit structure. In some embodiments, connection layer 108/108' includes tungsten and is deposited by one or more of CVD, PVD, ALD, and sputtering. In some embodiments, the adhesion layer includes TiN and is deposited by one or more of CVD, PVD, ALD, and sputtering.

In some embodiments, a 3D memory device includes a memory stack over a substrate. The memory stack includes interleaved a plurality of conductor layers and a plurality of insulating layers. The 3D memory device also includes a plurality of channel structures extending vertically in the memory stack. The 3D memory device also includes a source structure extending in the memory stack. The source structure includes first and second source contacts separated by a support structure. The source structure also includes an adhesion layer. At least a portion of the adhesion layer is between the first and second source contacts and conductively connects the first and second source contacts.

In some embodiments, the adhesion layer includes a first portion between the first source contact and the support structure, a second portion between the second source contact and the support structure, and a third portion extending through the support structure and conductively connecting the first and second portions.

In some embodiments, the first portion is in contact with the first source contact. The second portion is in contact with the second source contact.

In some embodiments, the 3D memory device also includes a first connection layer over the first source contact and a second connection layer over the second source contact. The support structure includes a cut layer over the third portion of the adhesion layer. The cut layer is between the first and second connection layers.

In some embodiments, at least one of the first connection layer, the second connection layer, or the cut layer includes at least one of tungsten, cobalt, aluminum, copper, silicide, or polysilicon.

In some embodiments, the adhesion layer also includes a fourth portion between the first connection layer and the cut layer and a fifth portion between the second connection layer and the cut layer. The fourth and fifth portions are conductively connected with the third portion.

In some embodiments, the support structure includes a cap layer over and in contact with the cut layer. The cap layer is between the first and second connection layers and separates the first and second connection layers.

In some embodiments, the cap layer includes silicon oxide.

In some embodiments, an upper surface of the cap layer and an upper surface of the first or second connection layer are coplanar.

In some embodiments, the fourth portion extends vertically along the support structure and between the first connection layer and the cap layer.

In some embodiments, the fifth portion extends vertically along the support structure and between the second connection layer and the cap layer.

In some embodiments, the adhesion layer includes a sixth portion between the first connection layer and the first source contact and a seventh portion between the second connection layer and the second source contact. The sixth and seventh portions are conductively connected with the third portion.

In some embodiments, along a lateral direction along which the source structure extends, a width of the cut layer is less than a width of the support structure under the third portion of the adhesion layer.

In some embodiments, the support structure includes interleaved a plurality of conductor portions and a plurality of insulating portions.

In some embodiments, each of the plurality of conductor portions is in contact with a corresponding conductor layer in a memory block adjacent to the source structure. Each of the plurality of insulating portions is in contact with a corresponding insulating layer in the memory block adjacent to the source structure.

In some embodiments, the 3D memory device further includes a spacer layer in contact with the interleaved plurality of conductor portions and insulating portions.

In some embodiments, the first or second source contact includes polysilicon.

In some embodiments, the adhesion layer comprises at least one of Ti, Ta, Cr, W, TiNx, TaNx, CrNx, WNx, TiSixNy, TaSixNy, CrSixNy, or WSixNy.

In some embodiments, the plurality of channel structures each includes an epitaxial portion in contact with and conductively connected to the substrate, a semiconductor channel in contact with and conductively connected to the epitaxial portion, and a drain structure in contact with and conductively connected to the semiconductor channel.

In some embodiments, a 3D memory device includes a memory stack over a substrate. The memory stack includes interleaved a plurality of conductor layers and a plurality of insulating layers. The 3D memory device also includes a plurality of channel structures extending vertically in the memory stack and a plurality of source structures extending in parallel along a lateral direction in the memory stack. The plurality of source structures each includes a plurality of source contacts arranged along the lateral direction and a plurality of support structures arranged along the lateral direction, each of the plurality of support structures separating two adjacent source contacts. Each of the plurality of source structures also includes an adhesion layer conductively connecting at least two of the plurality of source contacts separated by at least one of the support structures.

In some embodiments, at least a portion of the adhesion layer extends through the at least one of the support structures to conductively connect the at least two of the plurality of source contacts.

In some embodiments, the 3D memory device further includes a plurality of connection layers each over a corresponding source contact. At least two of the plurality of connection layers are in contact with and conductively connected to at least a portion of the adhesion layer.

In some embodiments, the at least one of the support structures includes a cut layer over the portion of the adhesion layer extending through the at least one of the support structures. The cut layer separates the at least two of the plurality of connection layers.

In some embodiments, at least a portion of the adhesion layer is between the cut layer and one of the at least two of the plurality of connection layers.

In some embodiments, the at least one of the support structures includes a cap layer over and in contact with the cut layer. The cap layer is between the at least two of the plurality of connection layers.

In some embodiments, the cap layer includes silicon oxide.

In some embodiments, an upper surface of the cap layer and an upper surface of one of the at least two of the plurality of connection layers are coplanar.

In some embodiments, along the lateral direction, a width of the cut layer is less than a width of the at least one of the support structures under the portion of the adhesion layer extending through the at least one of the support structures.

In some embodiments, the at least one of the support structures includes interleaved a plurality of conductor portions and a plurality of insulating portions.

In some embodiments, each of the plurality of conductor portions is in contact with a corresponding conductor layer in a memory block adjacent to the source structure including the at least one of the support structures. Each of the plurality of insulating portions is in contact with a corresponding insulating layer in the memory block adjacent to the source structure including the at least one of the support structures.

In some embodiments, the 3D memory device includes a spacer layer in contact with the interleaved plurality of conductor portions and insulating portions.

In some embodiments, the plurality of source contacts includes polysilicon.

In some embodiments, the adhesion layer includes at least one of Ti, Ta, Cr, W, TiNx, TaNx, CrNx, WNx, TiSixNy, TaSixNy, CrSixNy, or WSixNy.

In some embodiments, the plurality of channel structures each includes an epitaxial portion in contact with and conductively connected to the substrate, a semiconductor channel in contact with and conductively connected to the epitaxial portion, and a drain structure in contact with and conductively connected to the semiconductor channel.

In some embodiments, a method for forming a 3D memory device includes forming a cut structure in a stack structure. The stack structure includes interleaved a plurality of initial sacrificial layers and a plurality of initial insulating layers. The method also includes removing portions of the stack structure adjacent to the cut structure to form a slit structure and an initial support structure. The initial support structure divides the slit structure into a plurality of slit openings. The method also includes forming a plurality of conductor portions in the initial support structure through the plurality of slit openings. The method also includes forming a source contact in each of the plurality of slit openings. The method also includes removing portions of the initial support structure to form a support structure. The support structure includes an adhesion portion extending through the support structure. The method also includes forming an adhesion layer over the source contact in each of the plurality of slit openings. At least two adhesion layers are conductively connected to the adhesion portion extending through the support structure.

In some embodiments, to form the cut structure, the method includes forming a cut opening in the stack structure and depositing a dielectric material in the cut opening.

In some embodiments, forming the cut opening is in the same operations as forming a top select gate (TSG) cut.

In some embodiments, to form the cut structure, the method includes depositing an adhesion material over the dielectric material and depositing a conductive material over the adhesion material to fill up the cut opening.

In some embodiments, to form the cut structure, the method includes removing part of the deposited conductive material and part of the deposited adhesion material to form the cut structure.

In some embodiments, after forming the cut structure, the method further includes depositing a cap material over the cut structure and the stack structure.

In some embodiments, the method further includes removing portions of the deposited cap material adjacent to the cut structure in the same operations that remove portions of the stack structure adjacent to the cut structure to form the slit structure and the initial support structure.

In some embodiments, to remove the portions of the stack structure adjacent to the cut structure to form the slit structure and the initial support structure, the method includes removing portions of the stack structure adjacent to the cut structure along a lateral direction to form the slit structure that exposes the substrate.

In some embodiments, to form the plurality of conductor portions, the method includes removing, through the plurality of slit openings, a plurality of sacrificial portions in the initial support structure to form a plurality recess portions and depositing a conductor material to fill up the plurality of recess portions to form the plurality of conductor portions.

In some embodiments, the method further includes forming a spacer around the initial support structure.

In some embodiments, the method further includes depositing an adhesion material over the spacer. The deposited adhesion material forms part of the adhesion layer.

In some embodiments, to form the source contact, the method includes depositing polysilicon to fill up the respective slit opening.

In some embodiments, to remove portions of the initial support structure to form the support structure, the method includes etching back an upper part of the initial support structure to expose the adhesion portion.

In some embodiments, after etching back the upper part of the initial support structure, the method further includes depositing an adhesion material over the etched-back initial support structure such that the deposited adhesion material is in contact with the exposed adhesion portion.

In some embodiments, the method further includes forming a connection layer over the deposited adhesion material in each of the plurality of slit openings, such that at least two of the connection layers are conductively connected to source contacts in at least two slit openings.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

The invention claimed is:

1. A three-dimensional (3D) memory device, comprising:
   a memory stack over a substrate, the memory stack comprising interleaved a plurality of conductor layers and a plurality of insulating layers;
   a plurality of channel structures extending vertically in the memory stack; and
   a source structure extending in the memory stack, wherein the source structure includes:
      a first source contact and a second source contact separated by a support structure; and
      an adhesion layer, wherein at least a portion of the adhesion layer is between the first and second source contacts and conductively connects the first and second source contacts.

2. The 3D memory device of claim 1, wherein the adhesion layer comprises:
   a first portion between the first source contact and the support structure;
   a second portion between the second source contact and the support structure; and
   a third portion extending through the support structure and conductively connecting the first and second portions.

3. The 3D memory device of claim 2, wherein:
   the first portion is in contact with the first source contact; and
   the second portion is in contact with the second source contact.

4. The 3D memory device of claim 3, wherein the first and second source contacts each comprises polysilicon.

5. The 3D memory device of claim 2, further comprising:
   a first connection layer over the first source contact; and
   a second connection layer over the second source contact;
   wherein:
      the support structure comprises a cut layer over the third portion of the adhesion layer; and
      the cut layer is between the first and second connection layers.

6. The 3D memory device of claim 5, wherein the adhesion layer comprises:
   a fourth portion between the first connection layer and the cut layer; and
   a fifth portion between the second connection layer and the cut layer,
   wherein the fourth and fifth portions are conductively connected with the third portion.

7. The 3D memory device of claim 6, wherein the adhesion layer comprises:
   a sixth portion between the first connection layer and the first source contact; and
   a seventh portion between the second connection layer and the second source contact,
   wherein the sixth and seventh portions are conductively connected with the third portion.

8. The 3D memory device of claim 5, wherein:
   along a lateral direction along which the source structure extends, a width of the cut layer is less than a width of the support structure under the third portion of the adhesion layer.

9. The 3D memory device of claim 5, wherein the cut layer comprises polysilicon, silicon oxide, or a combination thereof.

10. The 3D memory device of claim 1, wherein the adhesion layer comprises at least one of Ti, Ta, Cr, W, TiNx, TaNx, CrNx, WNx, TiSixNy, TaSixNy, CrSixNy, or WSixNy.

11. The 3D memory device of claim 1, wherein the support structure comprises interleaved a plurality of conductor portions and a plurality of insulating portions.

12. A three-dimensional (3D) memory device, comprising:
   a memory stack over a substrate, the memory stack comprising interleaved a plurality of conductor layers and a plurality of insulating layers;
   a plurality of channel structures extending vertically in the memory stack; and
   a plurality of source structures extending in parallel along a lateral direction in the memory stack, wherein the plurality of source structures each comprises:
      a plurality of source contacts arranged along the lateral direction;
      a plurality of support structures arranged along the lateral direction, each of the plurality of support structures separating two adjacent source contacts; and
      an adhesion layer conductively connecting at least two of the plurality of source contacts separated by at least one of the support structures.

13. The 3D memory device of claim 12, wherein at least a portion of the adhesion layer extends through the at least one of the support structures to conductively connect the at least two of the plurality of source contacts.

14. The 3D memory device of claim 13, further comprising:
   a plurality of connection layers each over a corresponding source contact, wherein at least two of the plurality of connection layers are in contact with and conductively connected to at least a portion of the adhesion layer.

15. The 3D memory device of claim 14, wherein the at least one of the support structures comprises:
a cut layer over the portion of the adhesion layer extending through the at least one of the support structures, wherein the cut layer separates the at least two of the plurality of connection layers.

16. A three-dimensional (3D) memory device, comprising:
a memory stack over a substrate, the memory stack comprising interleaved a plurality of conductor layers and a plurality of insulating layers;
a plurality of channel structures extending vertically in the memory stack; and
a source structure extending in the memory stack, wherein the source structure includes:
a first source contact and a second source contact separated by a support structure; and
an adhesion layer below a top surface of the source structure and conductively connects the first and second source contacts, the top surface of the source structure being coplanar with a top surface of the support structure.

17. The 3D memory device of claim 16, wherein the adhesion layer comprises:
a first portion between the first source contact and the support structure;
a second portion between the second source contact and the support structure; and
a third portion extending through the support structure and conductively connecting the first and second portions.

18. The 3D memory device of claim 17, wherein:
the first portion is in contact with the first source contact; and
the second portion is in contact with the second source contact.

19. The 3D memory device of claim 17, further comprising:
a first connection layer over the first source contact; and
a second connection layer over the second source contact;
wherein:
the support structure comprises a cut layer over the third portion of the adhesion layer; and
the cut layer is between the first and second connection layers.

20. The 3D memory device of claim 19, wherein the adhesion layer comprises:
a fourth portion between the first connection layer and the cut layer; and
a fifth portion between the second connection layer and the cut layer,
wherein the fourth and fifth portions are conductively connected with the third portion.

* * * * *